United States Patent
Honda et al.

(10) Patent No.: US 9,601,365 B2
(45) Date of Patent: Mar. 21, 2017

(54) PEELING DEVICE, PEELING SYSTEM, AND PEELING METHOD

(71) Applicant: TOKYO ELECTRON LIMITED, Tokyo (JP)

(72) Inventors: Masaru Honda, Koshi (JP); Ryoichi Sakamoto, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/263,471

(22) Filed: Apr. 28, 2014

(65) Prior Publication Data

US 2014/0332166 A1 Nov. 13, 2014

(30) Foreign Application Priority Data

May 10, 2013 (JP) ................. 2013-100195

(51) Int. Cl.
| | |
|---|---|
| *B32B 38/10* | (2006.01) |
| *H01L 21/683* | (2006.01) |
| *H01L 21/67* | (2006.01) |
| *B32B 43/00* | (2006.01) |
| *B32B 38/18* | (2006.01) |

(52) U.S. Cl.
CPC .... *H01L 21/6838* (2013.01); *H01L 21/67092* (2013.01); *B32B 38/10* (2013.01); *B32B 38/1858* (2013.01); *B32B 43/006* (2013.01); *B32B 2309/62* (2013.01); *B32B 2457/14* (2013.01); *Y10T 156/1137* (2015.01); *Y10T 156/1168* (2015.01); *Y10T 156/1179* (2015.01); *Y10T 156/19* (2015.01); *Y10T 156/1961* (2015.01); *Y10T 156/1983* (2015.01)

(58) Field of Classification Search
CPC . B32B 38/10; B32B 43/006; Y10T 156/1983; Y10T 156/1179
USPC ....... 156/716, 765, 757, 707, 758, 708, 932, 156/943
See application file for complete search history.

(56) References Cited

U.S. PATENT DOCUMENTS

| | | | | |
|---|---|---|---|---|
| 6,201,306 | B1 * | 3/2001 | Kurosawa et al. | 257/783 |
| 8,192,578 | B2 * | 6/2012 | Haji | H01L 21/67092 156/707 |
| 8,360,129 | B2 * | 1/2013 | Ebata | B65H 41/00 156/714 |

(Continued)

FOREIGN PATENT DOCUMENTS

| | | |
|---|---|---|
| JP | 2010-10207 A | 1/2010 |
| JP | 2012-69914 A | 4/2012 |
| JP | 2013-33925 A | 2/2013 |

*Primary Examiner* — Mark A Osele
*Assistant Examiner* — Nickolas Harm
(74) *Attorney, Agent, or Firm* — Nath, Goldberg & Meyer; Jerald L. Meyer

(57) ABSTRACT

A peeling device separates a superposed substrate, in which a target substrate and a support substrate are joined to each other with an adhesive, into the target substrate and the support substrate. The peeling device includes a holding unit configured to hold the superposed substrate, and a plurality of position adjustment units movable forward and backward with respect to a side surface of the superposed substrate held in the holding unit, and the position adjustment unit configured to perform a position adjustment of the superposed substrate by contacting the side surface of the superposed substrate.

18 Claims, 26 Drawing Sheets

(56) References Cited

U.S. PATENT DOCUMENTS

| | | | |
|---|---|---|---|
| 2006/0231202 A1* | 10/2006 | Sakata et al. | 156/344 |
| 2006/0286768 A1* | 12/2006 | Arana | H01L 21/306 438/455 |
| 2009/0166930 A1* | 7/2009 | Fujita | B32B 38/10 264/334 |
| 2011/0139375 A1* | 6/2011 | Yamamoto et al. | 156/712 |
| 2012/0080150 A1* | 4/2012 | Riege et al. | 156/752 |
| 2013/0000684 A1* | 1/2013 | Soma | H01L 21/67051 134/36 |
| 2013/0048224 A1* | 2/2013 | George | H01L 21/67282 156/752 |

\* cited by examiner

PEELING DEVICE, PEELING SYSTEM, AND PEELING METHOD

CROSS-REFERENCE TO RELATED APPLICATION

This application claims the benefit of Japanese Patent Application No. 2013-100195, filed on May 10, 2013, in the Japan Patent Office, the disclosure of which is incorporated herein in its entirety by reference.

TECHNICAL FIELD

The present disclosure relates to a peeling device that peels a superposed substrate into a target substrate and a support substrate, a peeling system including the peeling device, and a peeling method using the peeling device.

BACKGROUND

In recent years, for example, in a manufacturing process of a semiconductor device, a semiconductor wafer (hereinafter, referred to as "wafer") becomes larger in diameter. Further, for a specific process such as packaging, the thickness of the wafer is required to be thinner. If the thin large-diameter wafer is transferred or it is subjected to a polishing process, there runs a risk of a warp or a crack occurring in the wafer. Therefore, in order to strengthen the wafer, for example, the wafer may be joined to an extra wafer or a glass substrate serving as a support substrate. Further, after a predetermined process such as the polishing of the wafer is performed in a state in which the wafer and the support substrate are joined to each other, the support substrate is peeled off from the wafer.

Conventionally, the process of peeling off of the support substrate from the wafer is performed using a peeling device. In the peeling device, the wafer is held using a first holding unit while the support substrate is held using a second holding unit, and the support substrate is peeled off from the wafer by vertically moving an outer peripheral portion of the second holding unit.

However, when holding the wafer and the support substrate by the first holding unit and the second holding unit, respectively, if the wafer and the support substrate are not appropriately held, it is difficult to accurately peel off the support substrate from the wafer. In such a case, there is a risk of damaging the wafer or the support substrate. Especially, since the thickness of the wafer is thin, the wafer may easily be damaged.

However, in this peeling device, position adjustments of the wafer and the support substrate with respect to the first holding unit and the second holding unit have not been considered. As such, there is a need for an improvement in a peeling process of the wafer and the support substrate.

SUMMARY

Some embodiments of the present disclosure provide a peeling device that appropriately performs a peeling process of a target substrate and a support substrate, a peeling system including the peeling device and a peeling method using the peeling device.

According to one embodiment of the present disclosure, there is provided a peeling device configured to separate a superposed substrate, in which a target substrate and a support substrate are joined to each other with an adhesive, into the target substrate and the support substrate, the peeling device including: a holding unit configured to hold the superposed substrate, and a plurality of position adjustment units movable forward and backward with respect to a side surface of the superposed substrate held in the holding unit, and the position adjustment unit configured to perform a position adjustment of the superposed substrate by contacting the side surface of the superposed substrate.

According to another embodiment of the present disclosure, there is provided a peeling system including the above-described peeling device, including: a peeling station including the peeling device, a carry-in/carry-out station configured to carry the target substrate, the support substrate, or the superposed substrate into and out of the peeling station, and a transfer device configured to transfer at least one of the target substrate, the support substrate, and the superposed substrate between the peeling station and the carry-in/carry-out station.

According to still another embodiment of the present disclosure, there is provided a peeling method of separating a superposed substrate, in which a target substrate and a support substrate are joined to each other with an adhesive, into the target substrate and the support substrate, including: holding the superposed substrate by a holding unit, performing a position adjustment of the superposed substrate by making a plurality of position adjustment units contacted with a side surface of the superposed substrate held by the holding unit, and separating the superposed substrate that is subjected to the position adjustment in the holding unit into the target substrate and the support substrate.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
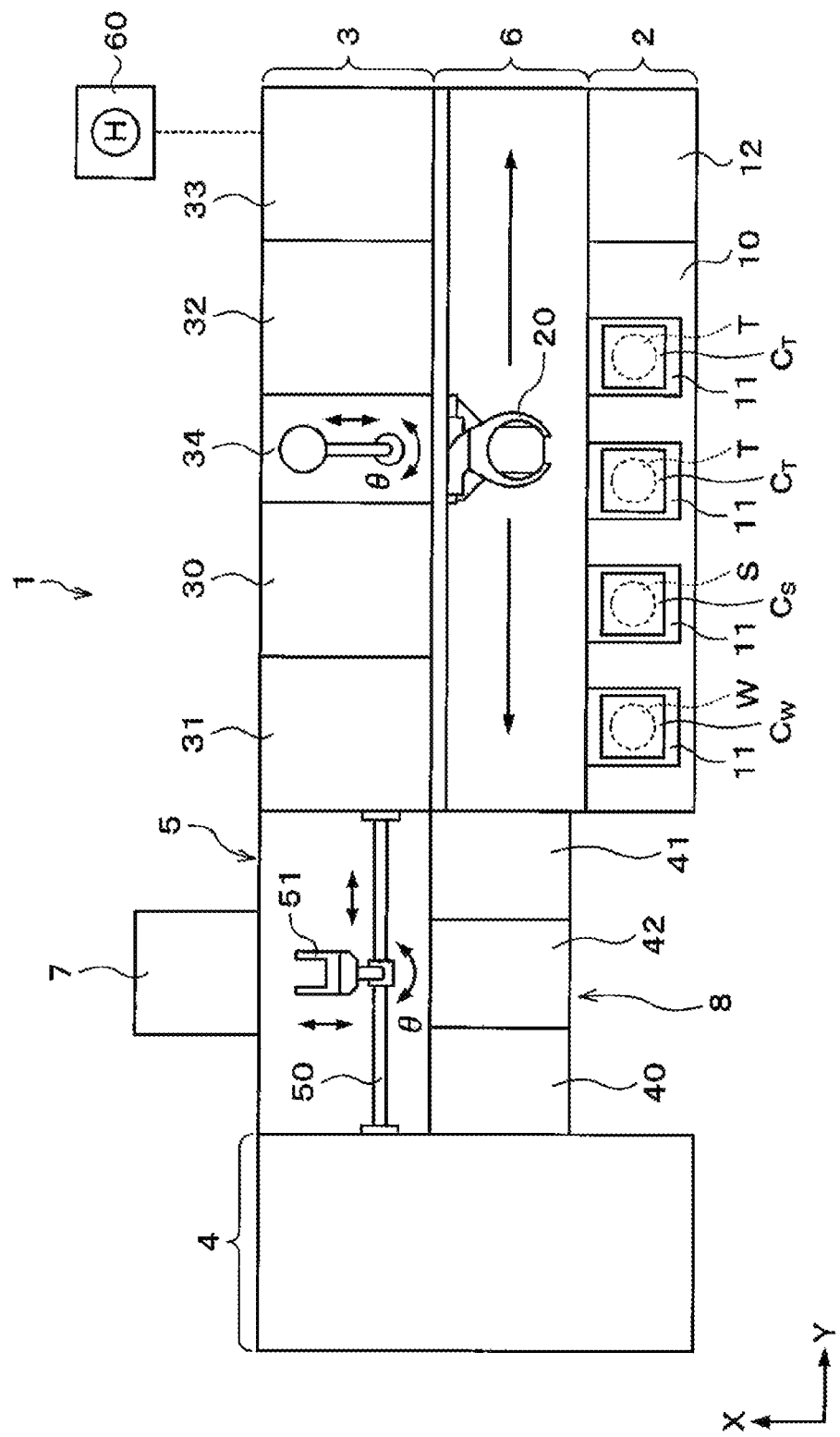
FIG. 1 is a schematic plan view illustrating a configuration of a peeling system according to one embodiment.

FIG. 1 is a plan view illustrating an outline of a configuration of a peeling system 1 according to one embodiment.

Figure 2:
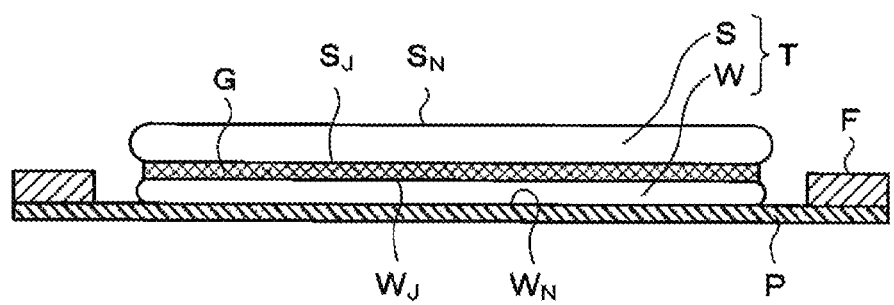
FIG. 2 is a vertical cross-sectional view of a superposed wafer held by a dicing frame and a dicing tape.
Figure 3:
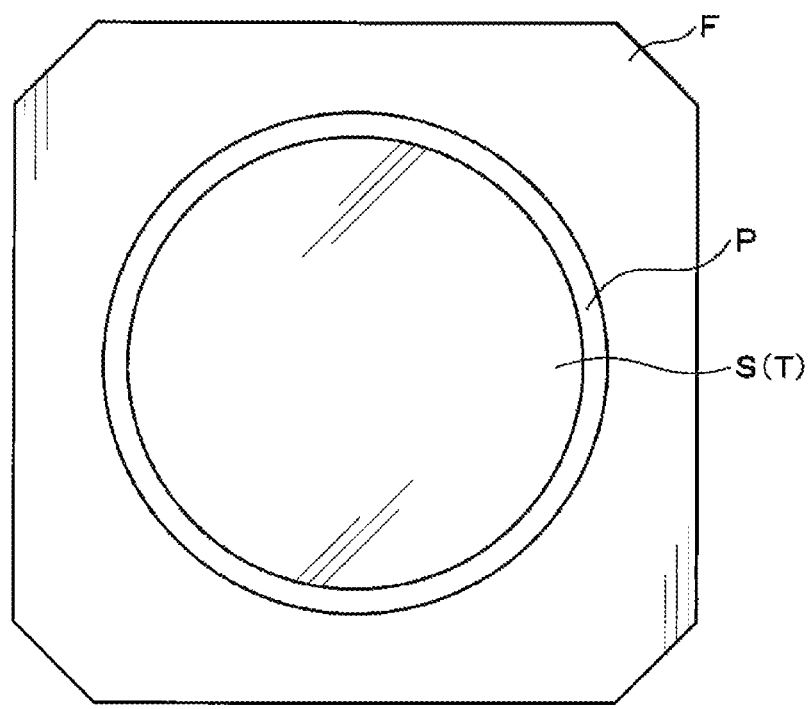
FIG. 3 is a plan view of a superposed wafer held by the dicing frame and the dicing tape.

In the peeling system 1, as illustrated in FIGS. 2 and 3, a superposed wafer T as a superposed substrate including a target wafer W as a target substrate and a support wafer S as a support substrate, which are joined to each other with an adhesive G, is separated into the target wafer W and the support wafer S. Hereinafter, in the target wafer W, one surface of the target wafer W which is bonded to the support wafer S via the adhesive G will be referred to as a "joint surface $W_J$", and a surface opposite the joint surface $W_J$ will be referred to as a "non-joint surface $W_N$". Similarly, in the support wafer S, a surface of the support wafer S to be bonded to the target wafer W via the adhesive G will be referred to as a "joint surface $S_J$", and a surface opposite the joint surface $S_J$ will be referred to as a "non-joint surface $S_N$".

The target wafer W is processed to become a product. On the joint surface $W_J$ of the target wafer W, for example, a plurality of devices including a plurality of electronic circuits and the like may be formed. Further, the thickness of the target wafer W may be processed to become thinner by performing a polishing process, e.g., on the non-joint surface $W_N$. Specifically, the thickness of the target wafer W is approximately 20 μm to 50 μm.

To support the target wafer W, the support wafer S may have a disk shape having substantially the same diameter as a diameter of the target wafer W. The thickness of the support wafer S is approximately 650 μm to 800 μm.

Further, although a case of using a wafer as a support substrate is described in this embodiment, other substrates such as a glass substrate may be used. In addition, the thickness of the adhesive G which bonds the target wafer W and the support wafer S is approximately 10 μm to 150 μm.

A dicing frame F and a dicing tape P are attached to the superposed wafer T. The dicing frame F has a substantially rectangular shape in a plan view, and has an annular opening formed thereinside along an outer peripheral portion of the superposed wafer T. Further, the superposed wafer T is disposed in the opening inside the dicing frame F. Further, the dicing frame F is a metal member and, for example, a stainless steel is used. Further, the thickness of the dicing frame F is approximately 1.5 mm.

The dicing tape P serving as an adhesive member is stretched over the opening of the dicing frame F. Specifically, a peripheral portion of the dicing tape P is fixed to a back side of the dicing frame F, and thus, the dicing tape P is stretched across the opening of the dicing frame F. Further, an adhesive layer is formed on a front surface of the dicing tape P, and the superposed wafer T is attached to the adhesive layer. In the superposed wafer T, the non-joint surface $W_N$ of the target wafer W is attached to the front surface of the dicing tape P. Thus, the superposed wafer T is held on the dicing frame F via the dicing tape P.

As illustrated in FIG. 1, the peeling system 1 has a configuration, for example, in which a carry-in/carry-out station 2, a peeling station 3, and an interface station 5 are integrally connected. Cassettes $C_W$, $C_S$, and $C_T$ capable of accommodating a plurality of target wafers W, a plurality of support wafer S, and a plurality of superposed wafers, respectively, are carried in and out between the carry-in/carry-out station 2 and the outside. The peeling station 3 includes various processing devices, each of which is configured to perform a predetermined process on the target wafers W, the support wafers S, or the superposed wafers T. The interface station 5 delivers the target wafers W between the peeling station 3 and a post-processing station 4 adjacent to the peeling station 3.

The carry-in/carry-out station 2 and the peeling station 3 are arranged side by side in the X-direction (a vertical direction in FIG. 1). A wafer transfer region 6 is formed between the carry-in/carry-out station 2 and the peeling station 3. The interface station 5 is disposed on a negative side in the Y-direction (a left side in FIG. 1) of the peeling station 3. An inspection device 7 configured to inspect the target wafer W before being delivered to the post-processing station 4 is disposed on a positive side in the X-direction (an upper side of FIG. 1) of the interface station 5. Further, on an opposite side of the inspection device 7 with the interface station 5 interposed therebetween, that is, on a side of the negative X-direction (a lower side in FIG. 1) of the interface station 5, a post-inspection cleaning station 8 is disposed, which is configured to perform a cleaning of the joint surface $W_J$ and the non-joint surface $W_N$ of the target wafer W after inspection, and a flip-over of the front and back sides of the target wafer W is disposed.

In the carry-in/carry-out station 2, a cassette mounting table 10 is installed. In the cassette mounting table 10, a plurality of, for example, three cassette mounting plates 11 are installed. The cassette mounting plates 11 are arranged side by side in a row in the Y-direction (a horizontal direction in FIG. 1). The cassettes $C_W$, $C_S$, $C_T$ can be mounted on the cassette mounting plates 11 when the cassettes $C_W$, $C_S$, $C_T$ are loaded and unloaded with respect to the outside of the peeling system 1. In this way, the carry-in/carry-out station 2 may accommodate the plurality of target wafers W, the plurality of support wafer S, and the plurality of superposed wafers T. The target wafers W and the superposed wafers T are held on the dicing frame F and the dicing tape P, respectively.

Further, the number of the cassette mounting plates 11 is not limited to this embodiment and may be arbitrarily determined. For example, one of the cassettes may be used for collecting a defective wafer. In this embodiment, one of the plurality of cassettes $C_T$ is used for collecting the defective wafer, and the rest of the cassettes $C_T$ is used to accommodate the normal superposed wafers T. In addition, the plurality of superposed wafers T carried into the carry-in/carry-out station 2 has been subjected to an inspection in advance and discriminated into a superposed wafer T including a normal target wafer W and a superposed wafer T including a defective target wafer W.

Further, a standby device 12 configured to temporarily put the superposed wafers T in a standby state by accommodating the plurality of superposed wafers T waiting for the processing is installed in the cassette mounting table 10. In the standby device 12, an ID reading mechanism configured to read an ID (identification) of the dicing frame F is installed, and the superposed wafers T are identified by the ID reading mechanism. Further, the standby device 12 may also adjust an orientation in the horizontal direction of the superposed wafers T by a position adjustment mechanism.

A first transfer device 20 is disposed in the wafer transfer region 6. For example, the first transfer device 20 has two transfer arms each movable in vertical and horizontal directions (Y-direction and X-direction) and about a vertical axis. One of the two transfer arms is a first transfer arm which holds and transfers the superposed wafers T or the target wafers W. The first transfer arm horizontally holds the superposed wafers T or the target wafers W, for example, by suction-holding or grasping the dicing frame F by a holding unit provided at a front end. The other is a second transfer arm which holds and transfers the support wafers S. The second transfer arm horizontally holds the support wafer S, for example, by forks or the like. Further, the first transfer device 20 can move in the wafer transfer region 6 to transfer the target wafers W, the support wafers S, and the superposed wafers T between the carry-in/carry-out station 2 and the peeling station 3.

Further, although in the wafer transfer region 6 of this embodiment, the first transfer device 20 equipped with the first and second transfer arms is installed, a transfer device only including a first transfer arm and a transfer device only including a second transfer arm may separately be installed.

The peeling station 3 has a peeling device 30 that is configured to separate the superposed wafer T into the target wafer W and the support wafer S. On a side of the negative Y-direction (left side in FIG. 1) of the peeling device 30, a first cleaning device 31 configured to clean the separated (i.e., peeled-off) target wafer W is disposed. Further, on a side of the positive Y-direction (a right side in FIG. 1) of the peeling device 30, a second cleaning device 32 configured to clean the peeled-off support wafer S is disposed. Further, on a side of the positive Y-direction (a right side in FIG. 1) of the second cleaning device 32, an edge cut device 33 configured to remove a peripheral portion of the adhesive G in the superposed wafer T before the peeling process is installed. Further, a second transfer device 34 is installed between the peeling device 30 and the second cleaning device 32. In this way, in the peeling station 3, the first cleaning device 31, the peeling device 30, the second transfer device 34, the second cleaning device 32, and the edge cut device 33 are sequentially disposed in this order from the interface station 5.

A configuration of the peeling device 30 will be described later. Further, as the first cleaning device 31 and the second cleaning device 32 described above, it is possible to use any suitable cleaning device capable of perform a cleaning process.

In the above-described edge cut device 33, a peripheral portion of the adhesive G is dissolved by a solvent by way of immersing the superposed wafer T in the solvent of the adhesive G. The peripheral portion of the adhesive G is removed by using such edge-cut process, which can make it easier to separate the target wafer W and the support wafer S in a peeling process which will be described later.

The second transfer device 34 has a transfer arm which e.g., holds the support wafer S in a non-contact state to maintain the same in a horizontal plane. The transfer arm may rotate about a horizontal axis and is able to reverse the front and back sides of the support wafer S held on the transfer arm. Further, the second transfer device 34 is able to transfer the support wafer from the peeling device 30 to the second cleaning device 32, while reversing the front and back sides of the peeled-off support wafer S.

In the inspection device 7, the presence or absence of the residue of the adhesive G on the target wafer W that has been peeled-off by the peeling device 30 is inspected. Such an inspection is performed, for example, by imaging the target wafer W held on a chuck.

In the post-inspection cleaning station 8, the target wafer W found to have the residue of the adhesive G in the inspection device 7 is subjected to a cleaning process. The post-inspection cleaning station 8 includes a joint surface cleaning device 40 configured to clean a joint surface $W_J$ of the target wafer W, a non-joint surface cleaning device 41 configured to clean the non-joint surface $W_N$ of the target wafer W, and a reversing device 42 configured to turn the front and back sides of the target wafer W upside down. The joint surface cleaning device 40, the reversing device 42, and the non-joint surface cleaning device 41 are disposed in a line in the Y-direction from the post-processing station 4 side.

The configurations of the joint surface cleaning device 40 and the non-joint surface cleaning device 41 are the same as that of the above-described first cleaning device 31.

In the interface station 5, a third transfer device 51 movable on a transfer path 50 extending in the Y-direction is installed. The third transfer device 51 has a transfer arm configured to, for example, suction-hold or grasp the dicing frame F of the target wafer W to maintain the target wafer W in a horizontal plane. Further, the third transfer device 51 can also be moved in the vertical direction and around the vertical axis (θ-direction) and able to transfer the target wafer W among the peeling station 3, the post-processing station 4, the inspection device 7, and the post-inspection cleaning station 8.

In the post-processing station 4, a predetermined post-processing is performed on the target wafer W peeled-off by the peeling station 3. As the predetermined post-processing, for example, a process of inspecting the electrical characteristics of the devices on the target wafer W or the like is performed.

In the above-described peeling system 1, a control unit 60 is installed as illustrated in FIG. 1. The control unit 60 is, for example, a computer and includes a program storage unit (not illustrated) therein. In the program storage unit, a program for controlling processes for the target wafer W, the support wafer S, and the superposed wafer T in the peeling system 1 is stored. Further, a program for controlling operations of the driving system such as various processing devices or transfer devices described above to implement the peeling process described later in the peeling system 1 is also stored in the program storage unit. Further, the programs may be installed in the control unit 60 from a non-transitory computer-readable storage medium H such as a computer-readable storage medium H such as a computer-readable hard disk (HD), a flexible disk (FD), a compact disc (CD), a magneto-optical desk (MO), and a memory card, on which the programs are previously recorded.

Figure 4:
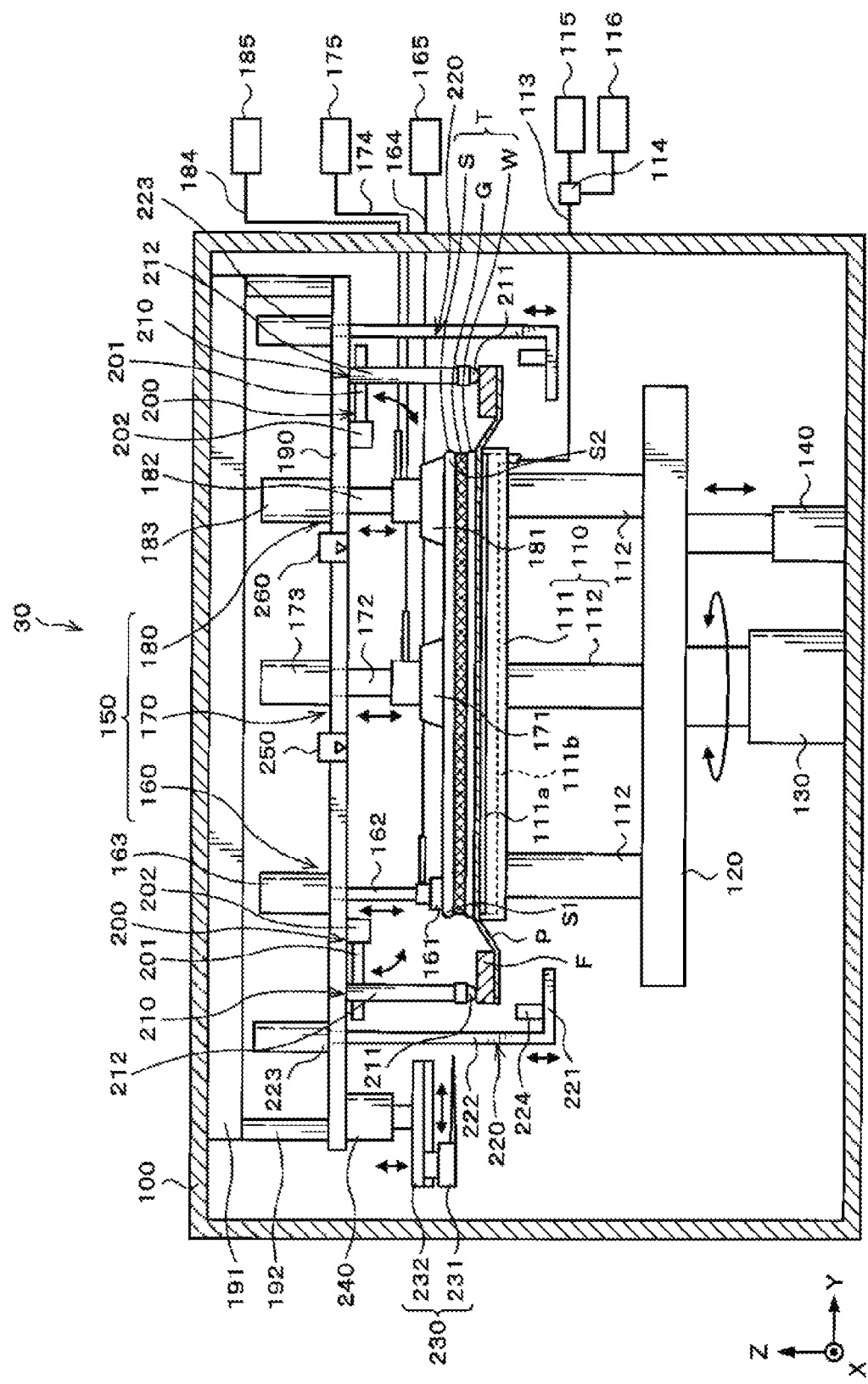
FIG. 4 is a vertical cross-sectional view illustrating an outline of a configuration of a peeling device.

Next, a configuration of the above-described peeling device 30 will be described. The peeling device 30 has a processing container 100 as illustrated in FIG. 4. On a side surface of the processing container 100, an inlet/outlet port (not illustrated) for carrying in and/or out the target wafer W, the support wafer S, and the superposed wafer T is formed, and an opening/closing shutter (not illustrated) is installed in the inlet/outlet port.

In the interior of the processing container 100, a first holding unit 110, a lower base unit 120, a rotation mechanism 130, an elevating mechanism 140, a second holding unit 150, and an upper base unit 190, a position adjustment unit 200, a pressing unit 210, a delivery unit 220, a peeling inducement unit 230, a movement adjustment unit 240, and measurement units 250 and 260, which will be described later, are installed.

The first holding unit 110 holds the target wafer W of the superposed wafers T from the bottom, and the second holding unit 150 holds the support wafer S of the superposed wafers T from the top. The first holding unit 110 is installed below the second holding unit 150, the target wafer W is disposed on the lower side, and the support wafer S is disposed on the upper side. Further, the second holding unit 150 moves the support wafer S held thereon in a direction away from a surface of the target wafer W. Thus, in the peeling device 30, the superposed wafer T is separated into the target wafer W and the support wafer S. Hereinafter, each of the components will be described in detail.

For example, a porous chuck is used in the first holding unit 110. The first holding unit 110 includes a disk-shaped main body 111, and a pillar member 112 configured to support the disk-shaped main body 111. The pillar member 112 is supported on a lower base unit 120 which will be described later.

The disk-shaped main body 111 is made by, for example, a metal member such as aluminum. A suction surface 111a is provided on the surface of the disk-shaped main body 111. The suction surface 111a has a diameter approximately equal to that of the superposed wafer T and comes into contact with a lower surface of the superposed wafer T, i.e., the non-joint surface $W_N$ of the target wafer W. The suction surface 111a is formed of, for example, a porous body or a porous ceramic such as silicon carbide.

A suction space 111b communicating with the outside via the suction surface 111a is formed inside the disk-shaped main body 111. A pipe 113 is connected to the suction space 111b. The pipe 113 is branched into two pipes through a valve 114. For example, a suction device 115 such as a vacuum pump is connected to one pipe 113. A gas supply source 116 configured to store a gas, e.g., nitrogen gas or air therein is connected to the other pipe 113.

The first holding unit 110 suction-holds the non-joint surface $W_N$ of the target wafer W on the suction surface 111a via the dicing tape P, using a negative pressure generated by the air intake of the suction device 115. In this way, the first holding unit 110 holds the target wafer W. Further, the first holding unit 110 may hold and support the target wafer W in such a way to, e.g., float the target wafer W by ejecting a gas from its surface. Further, although a case in which the first holding unit 110 is a porous chuck is exemplified, the first holding unit may be, for example, an electrostatic chuck or the like.

The lower base unit 120 is disposed below the first holding unit 110 to support the first holding unit 110. The lower base unit 120 is supported by the rotation mechanism 130 and the elevating mechanism 140 fixed to a bottom surface of the processing container 100.

The rotation mechanism 130 rotates the lower base unit 120 about the vertical axis. Thus, the first holding unit 110 supported on the lower base unit 120 rotates. Further, the elevating mechanism 140 moves the lower base unit 120 in the vertical direction. Thus, the first holding unit 110 supported on the lower base unit 120 moves up and down.

The second holding unit 150 is disposed above the first holding unit 110, facing each other. The second holding unit 150 includes a plurality of suction moving units. Specifically, the second holding unit 150 includes a first suction moving unit 160, a second suction moving unit 170, and a third suction moving unit 180. The first to third suction moving units 160, 170, and 180 are supported by the upper base unit 190. The upper base unit 190 is supported by a fixed member 191 attached to a ceiling of the processing container 100 via columns 192.

The first suction moving unit 160 suction-holds the peripheral portion of the support wafer S adjacent to one end 51 thereof. Further, the second suction moving unit 170 suction-holds a region in the vicinity of a central portion of the support wafer S rather than the peripheral portion of the support wafer S. Further, a plurality of (for example, two) second suction moving units 170 is disposed side by side in the X-direction. A third suction moving unit 180 suction-holds the peripheral portion of the other end S2 of the support wafer S. Further, the first to third suction moving units 160, 170, and 180 each independently move the regions suction-held thereby in a direction away from the surface of the target wafer W, respectively.

The first suction moving unit 160 includes a suction pad 161, a pillar member 162, and a movement mechanism 163. Further, the second suction moving unit 170 includes a suction pad 171, a pillar member 172, and a movement mechanism 173. Similarly, the third suction moving unit 180 also includes a suction pad 181, a pillar member 182, and a movement mechanism 183.

The suction pads 161, 171, and 181 are formed by an elastic member such as rubber. Each of the suction pads 161, 171, and 181 is formed with a suction port (not illustrated), and suction devices 165, 175, and 185 such as vacuum pumps are connected to each of the suction ports via suction pipes 164, 174, and 184.

The pillar members 162, 172, and 182 support the suction pads 161, 171, and 181 at their leading ends, respectively. Proximal end of the pillar members 162, 172, and 182 are supported by the movement mechanisms 163, 173, and 183, respectively. The movement mechanisms 163, 173, and 183 are fixed to the upper portion of the upper base unit 190 and vertically move the pillar members 162, 172, and 182.

The first to third suction moving units 160, 170, and 180 suction-hold the support wafers S using a negative pressure generated by the air intake of the suction devices 165, 175, and 185. Thus, the first to third suction moving units 160, 170, and 180 hold and support the support wafers S.

In addition, the first to third suction moving units 160, 170, and 180 move the pillar members 162, 172, and 182 and the suction pads 161, 171, and 181 by the movement mechanisms 163, 173, and 183 disposed along the vertical direction, respectively, while holding the support wafers S. Thus, the support wafers S are moved along the vertical direction.

In the second holding unit 150, the movement mechanism 163 is first operated, the movement mechanism 173 is then operated, and the movement mechanism 183 is finally operated. That is, the second holding unit 150 first pulls the peripheral portion of the one end S1 of the support wafer S, then pulls the central portion, and finally pulls the peripheral portion of the other end S2. Thus, the second holding unit 150 gradually and continuously peels off the support wafer S from the target wafer W toward the other end S2 from one end S1. This operation will be specifically described later.

Position adjustment units 200 are disposed above the first holding unit 110. The position adjustment unit 200 performs the position adjustment of the superposed wafer T, which is transferred to the peeling device 30 by the first transfer device 20 and is held on the first holding unit 110, to a predetermined position (for example, a position coincides with that of the suction surface 111a), i.e., centering of the superposed wafer T.

The position adjustment units 200 are each installed at positions corresponding to the three positions of the outer periphery of the superposed wafer T, for example, illustrated in FIG. 3, at equal intervals from one another about the central portion of the superposed wafer T. Further, the installation positions of the position adjustment units 200 are not limited to the above-described three positions, but may be installed, for example, at front and back or left and right two positions of the outer periphery of the superposed wafer T, or, for example, at four positions or more at regular intervals around the central portion of the superposed wafer T.

Figure 5:
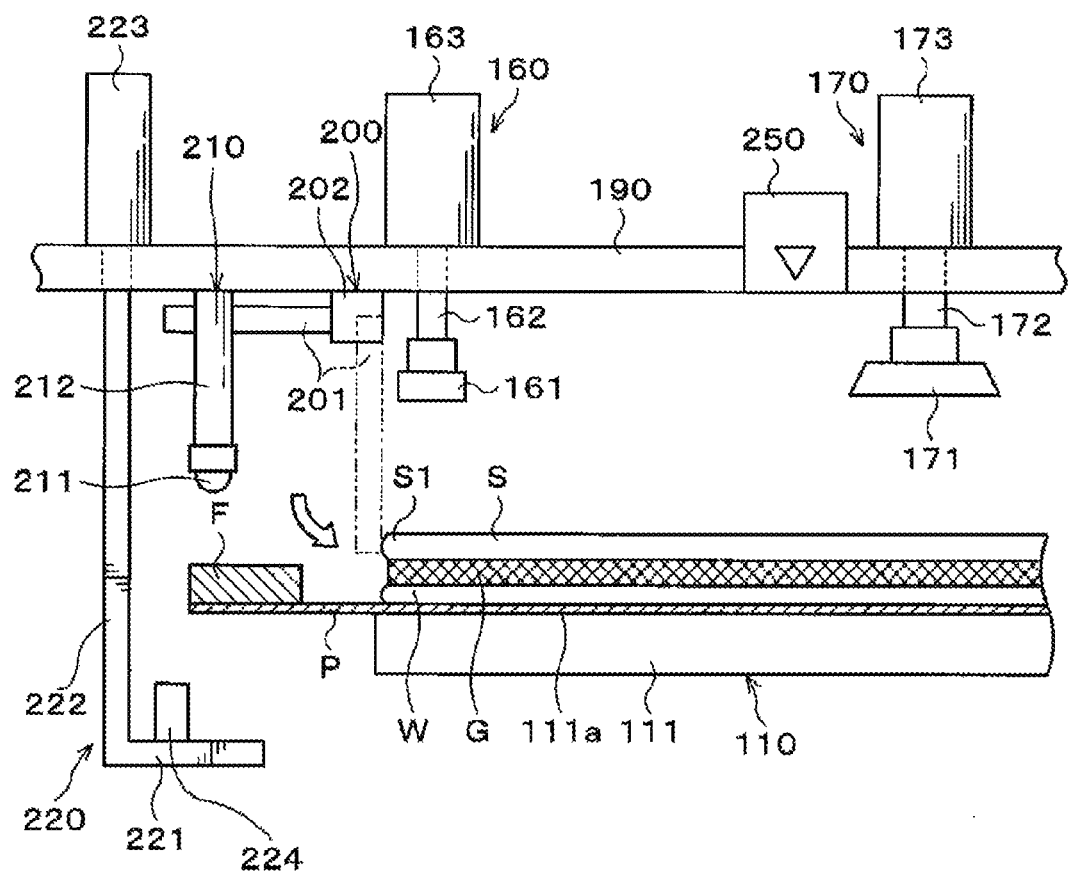
FIG. 5 is an enlarged explanatory view of a periphery of a position adjustment unit.

As illustrated in FIG. 5, the position adjustment unit 200 includes an arm unit 201, and a rotational movement mechanism 202 configured to rotate the arm unit 201. The arm unit 201 is an elongated member, and its proximal end thereof is rotatably connected to the rotational movement mechanism 202. Further, for example, a length of the arm unit 201 is set to a value such that, for example, its leading end comes into contact with a side surface of the superposed wafer T, more specifically, a side surface of the support wafer S, when the arm unit 201 is rotated by the rotational movement mechanism 202 until the leading end thereof is directed vertically downward, and is set to a value such that the arm unit 201 does not interfere with the dicing frame F during its rotational movement. In this way, the arm unit 201 may be moved forward and backward with respect to the side surface of the superposed wafer T. Further, various types of resin for example, polyoxymethylene (POM), Cerasol (PBI) or the like is used for the arm unit 201.

The rotational movement mechanism 202 is fixed to, for example, a lower portion of the upper base unit 190 and rotates the arm unit 201 around the proximal end. At this time, as described above, the rotationally moving arm unit 201 does not interfere with the dicing frame F. When the arm unit 201 of the respective position adjustment unit 200 is rotated by the rotational movement mechanism 202, as illustrated by the imaginary lines in FIG. 5, the leading end of the arm unit 201 comes into contact with the side surface of the superposed wafer T (side surface of the support wafer S). Thus, a position of the superposed wafer T is adjusted to a predetermined position. In this way, even when the superposed wafer T is held on the first holding unit 110 while being shifted from a predetermined position, it is possible to move the superposed wafer T to a correct position of the first holding unit 110, specifically, for example, to a position matching that of the suction surface 111a by providing the position adjustment unit 200.

Figure 6:
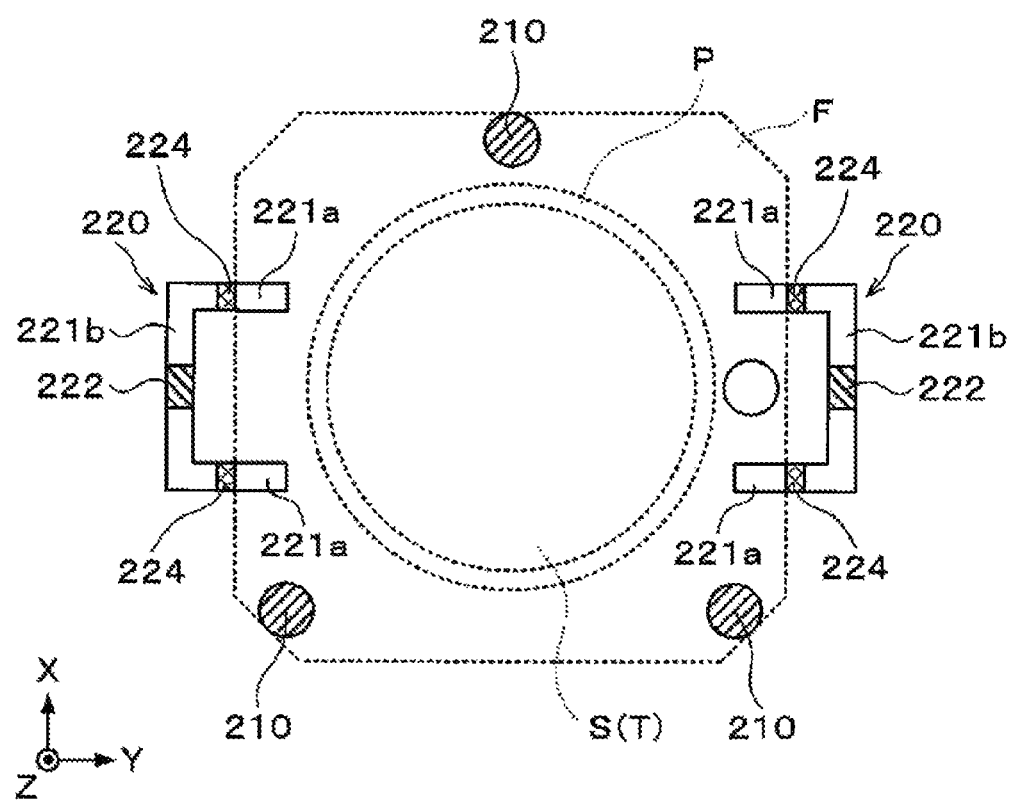
FIG. 6 is a horizontal cross-sectional view illustrating an arrangement between a pressing unit and a delivery unit.

As illustrated in FIG. 4, a pressing unit 210 for pressing the dicing frame F vertically downward is disposed outside the second holding unit 150. The pressing units 210 are installed, for example, at three positions of the outer peripheral portion of the dicing frame F, as illustrated in FIG. 6. The pressing units 210 are disposed at equal intervals from one another around the central portion of the dicing frame F. Further, in the above description, the pressing units 210 are installed at three positions, but not limited thereto, and the pressing units 210 may be installed, for example, at four or more positions.

Figure 7:
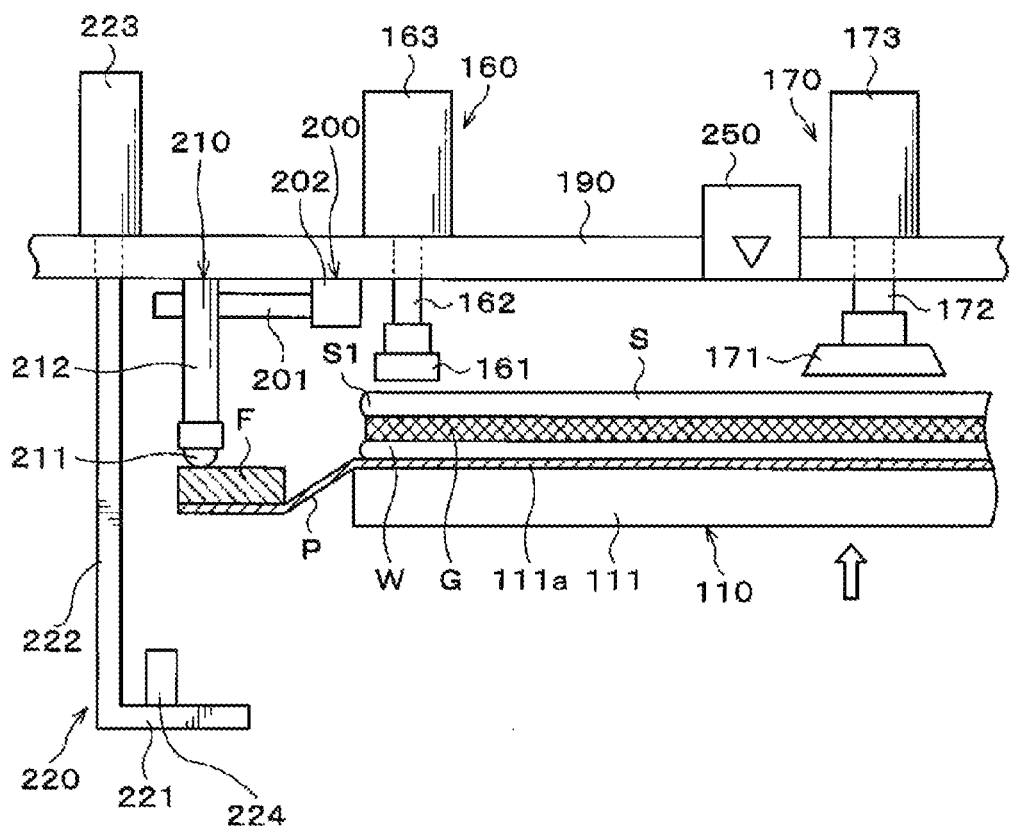
FIG. 7 is an enlarged explanatory view of a periphery of the pressing unit.

As illustrated in FIG. 7, the pressing unit 210 includes a ball bearing 211 and a support member 212. The ball bearing 211 is supported by a leading end of the support member 212, and a proximal end of the support member 212 is fixed to the lower portion of the upper base unit 190.

The ball bearing 211 comes into contact with the surface of the dicing frame F and presses the dicing frame F vertically downward with respect to the superposed wafer T. Although the dicing frame F is pressed downward, it is in a rotatable state since the pressing is made via the ball bearing 211. As a result, a space into which a peeling inducement unit 230 to be described later can burrow, is formed on the side surface side of the superposed wafer T. Thus, it is possible to easily bring a sharp member of the peeling inducement unit 230 (described below) close to and into contact with a side surface of the superposed wafer T, and more specifically, a side surface of the support wafer S in the vicinity of the adhesive G.

As illustrated in FIG. 4, a delivery unit 220 configured to deliver the superposed wafer T to the first holding unit 110 is disposed on the outside of the second holding unit 150, specifically, the outside of the pressing unit 210. The delivery units 220 are installed at positions corresponding to the two positions of the left and right sides of the dicing frame F, for example, as illustrated in FIG. 6. Further, the delivery units 220 are installed at two positions in the above description, but are not limited thereto. For example, the delivery units 220 may be installed at three or more positions.

Figure 8:
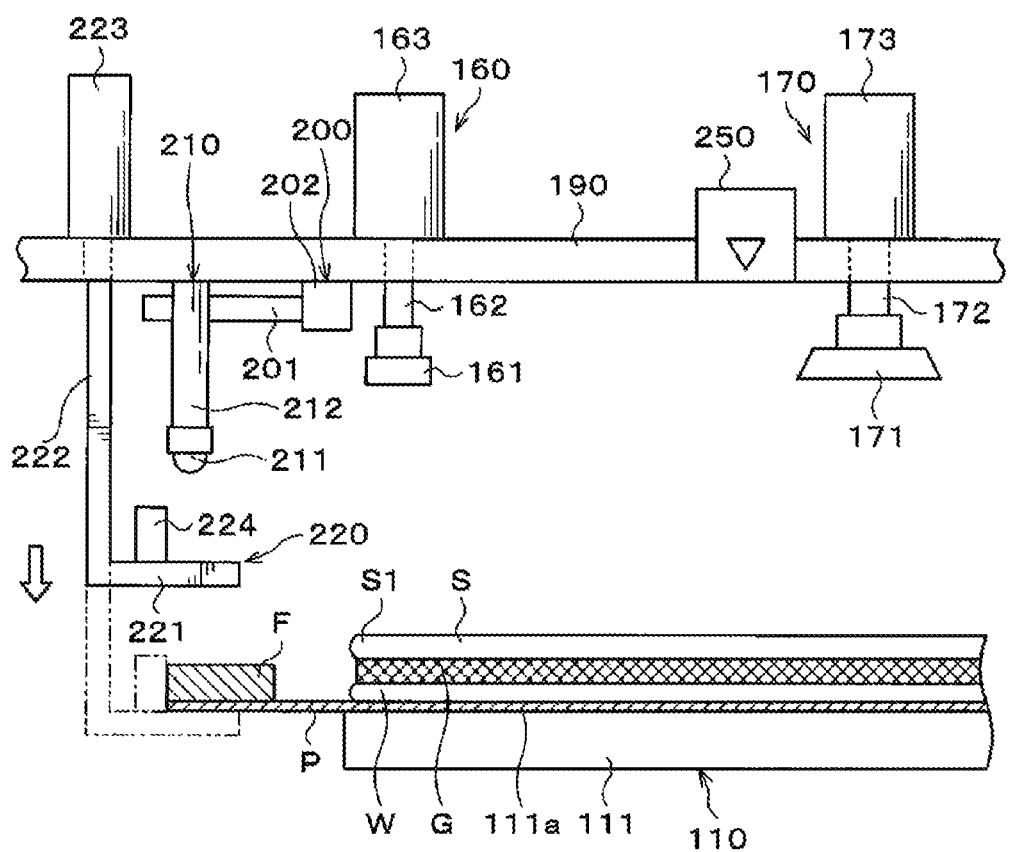
FIG. 8 is an enlarged explanatory view of a periphery of the delivery unit.

As illustrated in FIG. 8, the delivery unit 220 includes a horizontal holding member 221, a vertical support member 222, and a movement mechanism 223. Also, a guide unit 224 is installed in the horizontal holding member 221 of the delivery unit 220.

As illustrated in FIG. 6, the horizontal holding member 221 has a pair of leading ends 221a, 221a, and a proximal end 221b connected to the pair of leading ends 221a, 221a. The leading ends 221a extend in the Y-direction, and the proximal end 221b extends in the X-direction. In addition, the horizontal holding member 221 is configured to not interfere with the pressing unit 210.

The guide units 224 are installed on the leading ends 221a of the horizontal holding member 221, respectively. The guide units 224 perform a position adjustment so that the superposed wafer T held on the horizontal holding member 221 is positioned at a predetermined position with respect to the first holding unit 110. That is, the guide units 224 perform the position adjustment of the superposed wafer T prior to the position adjustment of the superposed wafer T by the position adjustment unit 200.

The vertical support member 222 extends in the vertical direction as illustrated in FIG. 8 to support the horizontal holding member 221. Further, the proximal end of the vertical support member 222 is supported by the movement mechanism 223. The movement mechanism 223 is fixed to the upper portion of the upper base unit 190 and moves the vertical support member 222 in the vertical direction.

The delivery unit 220 moves the vertical support member 222, the horizontal holding member 221, and the guide unit 224 along the vertical direction by a movement mechanism 223. Therefore, the horizontal holding member 221, when receiving the superposed wafer T from the first transfer device 20, moves in the vertical direction and delivers the superposed wafer T to the first holding unit 110, as illustrated with the imaginary line in FIG. 8.

As illustrated in FIG. 4, the peeling inducement unit 230 is disposed outside the second holding unit 150, specifically, outside the delivery unit 220. The peeling inducement unit 230 forms a region, at which the process of peeling off the support wafer S from the target wafer W is initiated, on the side surface of the superposed wafer T adjacent to one end S1.

The peeling inducement unit 230 includes a sharp member 231, and a movement mechanism 232. The sharp member 231 is, for example, a blade that is supported by the movement mechanism 232 so that a leading end thereof protrudes toward the superposed wafer T. In addition, as the sharp member 231, for example, a razor blade, a roller blade, an ultrasonic cutter or the like may be used.

The movement mechanism 232 moves the sharp member 231 along a rail extending in the Y direction. In the peeling inducement unit 230, the sharp member 231 is moved by the movement mechanism 232, and is brought into contact with the lateral side of the support wafer S in the vicinity of the adhesive G. With this configuration, the peeling inducement unit 230 forms the region (hereinafter, referred to as "peeling initiation region"), at which the process of peeling off the support wafer S from the target wafer W is initiated, in the lateral side of the superposed wafer T adjacent to the one end S1.

In addition, the movement mechanism 232 is supported by the movement adjustment unit 240 from the top. The movement adjustment unit 240 is fixed to, for example, the lower portion of the upper base unit 190 to move the movement mechanism 232 along the vertical direction. With this configuration, it is possible to adjust a vertical position of the sharp member 231, i.e., a contact position thereof with the lateral side of the superposed wafer T.

Figure 9:
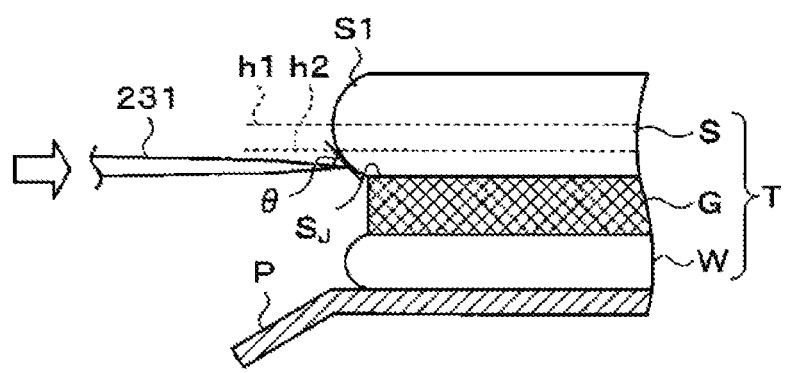
FIG. 9 is an explanatory view illustrating a peeling inducement process.
Figure 10:
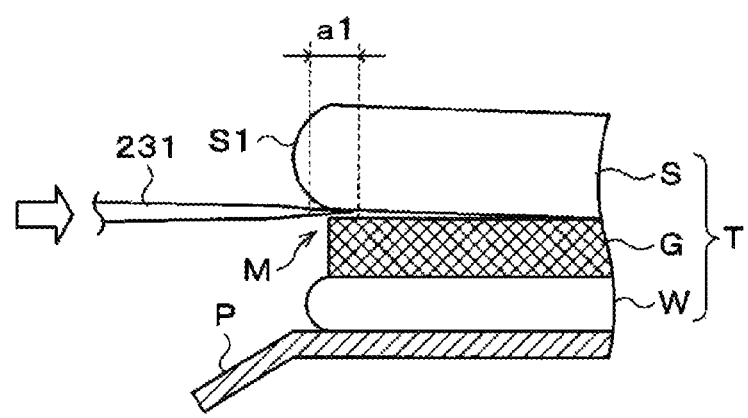
FIG. 10 is an explanatory view illustrating a peeling inducement process.
Figure 11:
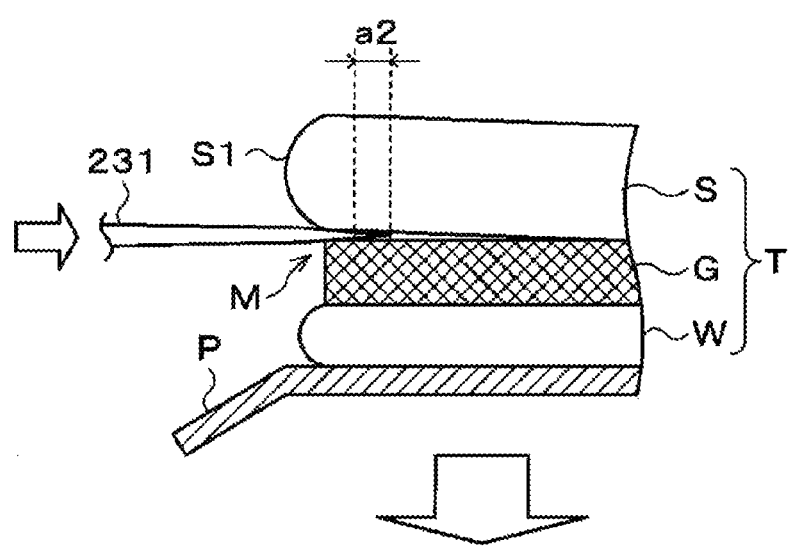
FIG. 11 is an explanatory view illustrating a peeling inducement process.

Here, the peeling inducement processing performed using the peeling inducement unit 230 will be described in detail with reference to FIGS. 9 to 11. FIGS. 9 to 11 are explanatory views illustrating the operation of the peeling inducement processing.

In addition, the peeling inducement processing is performed after the target wafer W of the superposed wafer T is held by the first holding unit 110 and the dicing frame F is pressed downward by the pressing unit 210, and before the support wafer S is held by the second holding unit 150. That is, the peeling inducement processing is performed in a state where the support wafer S is not yet contacted by the second holding unit 150. In addition, the peeling inducement unit 230 performs the peeling inducement processing shown in FIGS. 9 to 11 based on the control of the control unit 60.

In the peeling inducement unit 230, the movement adjustment unit 240 is used to adjust the vertical position of the sharp member 231, and then, the movement mechanism 232 is used to move the sharp member 231 toward the lateral side of the superposed wafer T. Specifically, as shown in FIG. 9, the sharp member 231 is substantially horizontally moved toward the lateral side of the support wafer S in the vicinity of the adhesive G of the lateral side of the superposed wafer T adjacent to the one end S1.

"The lateral side of the support wafer S in the vicinity of the adhesive G" refers to a lateral side of the support wafer S in the vicinity of the joint surface Sj rather than a half thickness position h1 of the support wafer S. That is, the lateral side of the support wafer S is formed in a shape of an approximately circular arc, and "the lateral side of the support wafer S in the vicinity of the adhesive G" is a lateral side forming an angle θ with the sharp member 231 that ranges from 0 degrees to less than 90 degrees when an angle between the sharp member 231 and the joint surface Sj is defined as 0 degrees.

First, the sharp member 231 is advanced up to a predetermined position (preliminary advance). Thereafter, the sharp member 231 is further advanced to come into contact with the lateral side of the support wafer S in the vicinity of the adhesive G. In addition, the peeling inducement unit 230 is provided with, for example, a load cell (not shown), and a load applied to the sharp member 231 is detected using the load cell, thereby detecting whether the sharp member 231 is in contact with the support wafer S.

As described above, the lateral side of the support wafer S is formed in the shape of an approximately circular arc. Therefore, as the sharp member 231 is into contact with the lateral side of the support wafer S in the vicinity of the adhesive G, an upward force is exerted to the support wafer S.

As shown in FIG. 10, the sharp member 231 is further advanced. Accordingly, the support wafer S is pushed upward along the curvature of the lateral side. As a result, a portion of the support wafer S is peeled off from the adhesive G to form a peeling initiation region M.

In addition, since the support wafer S is not held by the second holding unit 150 and is in a free state, the support wafer S is not hindered from moving upward. In this processing, a distance a1 by which the sharp member 231 is advanced is, for example, 2 mm or so.

Also, the peeling device 30 may be configured to include a confirmation device (not shown) configured to confirm a peeled-off state of the support wafer S by the above processing, specifically a confirmation device configured to confirm whether the peeling initiation region M is formed. Specifically, the confirmation device includes, for example, an infrared (IR) camera (not shown) installed above the support wafer S.

In detail, a reflectance of an infrared ray at a region of the support wafer S peeled off from the target wafer W is different from that at a region of the support wafer S not peeled off. Therefore, as the IR camera first captures an image of the support wafer S, an image data representing a difference in infrared reflectance or the like in the support wafer S is acquired. Then, the image data is transmitted to the control unit 60, and the control unit 60 may detect the region of the support wafer S peeled off from the target wafer W, i.e., the peeling initiation region M, based on the image data.

When the control unit 60 detects the peeling initiation region M, the subsequent processing described later is performed. In the meantime, when the control unit 60 does not detect the peeling initiation region M, the peeling initiation region M is formed, for example, by further advancing the sharp member 231, or by first retracting the sharp member 231 to be separated from the support wafer S and then performing the operations shown in FIGS. 9 and 10 again. As described above, as the confirmation device configured to confirm a peeled-off state of the support wafer S is installed and the peeling device 30 is operated according to the peeled-off state, the peeling initiation region M may be well formed.

If the peeling initiation region M is formed, then, as shown in FIG. 11, the peeling device 30 lowers the first holding unit 110 using the elevating mechanism 140 and further advances the sharp member 231. Accordingly, a downward force is applied to the target wafer W and the adhesive G, and an upward force is applied to the support wafer S supported by the sharp member 231. With this configuration, the peeling initiation region M is enlarged.

In this processing, a distance a2, by which the sharp member 231 is advanced, is, for example, 1 mm or so.

As the sharp member 231 is brought into contact with the lateral side of the support wafer S in the vicinity of the adhesive G as described above, the peeling device 30 can form the peeling initiation region M, which triggers the process of peeling off of the support wafer S from the target wafer W, in the lateral side of the superposed wafer T.

The support wafer S has a thickness about 5 to 15 times larger than that of the adhesive G. Therefore, as compared with a case where a peeling initiation region is formed by bringing the sharp member 231 into contact with the adhesive G, it is easy to control the position of the sharp member 231 in the vertical direction.

In addition, as the sharp member 231 is brought into contact with the lateral side of the support wafer S in the vicinity of the adhesive G, a force (i.e., an upward force) can be applied to the support wafer S in a direction in which the support wafer S is peeled off from the target wafer W. Further, since a region close to the outermost peripheral portion of the support wafer S is lifted up, the force in the direction in which the support wafer S is peeled off from the target wafer W can be efficiently applied to the support wafer S.

In addition, as compared with a case where the sharp member 231 is brought into contact with the adhesive G, it is possible to reduce the possibility that the sharp member 231 is brought into contact with the target wafer W.

More specifically, "the lateral side of the support wafer S in the vicinity of the adhesive G" is a lateral side of the support wafer S ranging from the joint surface Sj of the support wafer S to a quarter thickness position h2 of the support wafer S, as shown in FIG. 9, i.e., a lateral side that forms the angle θ with the sharp member 231 ranging from not less than 0 degree to not more than 45 degrees. This is because the smaller the angle θ between the lateral side and the sharp member 231 is, the larger the force lifting the support wafer S up is.

In addition, when the adhesive strength between the support wafer S and the adhesive G is relatively weak, a simple abutment of the sharp member 231 to the lateral side of the support wafer S in the vicinity of the adhesive G, as shown in FIG. 9, may form the peeling initiation region M. In such a case, the operations shown in FIGS. 10 and 11 can be omitted.

When the adhesive strength between the support wafer S and the adhesive G is relatively strong, for example, the peeling device 30 may further rotate the rotation mechanism 130 from the state shown in FIG. 11 and may rotate the first holding unit 110 around the vertical axis, for example, 360 degrees. In that case, the first holding unit 110 can be rotated in a state where the dicing frame F is being pressed down by the pressing unit 210 since the pressing unit 210 has a ball bearing 211. Accordingly, the peeling initiation region M can be formed over the entire circumference of the joint surface Sj of the support wafer S, so that the support wafer S can be easily peeled off from the target wafer W.

Figure 12:
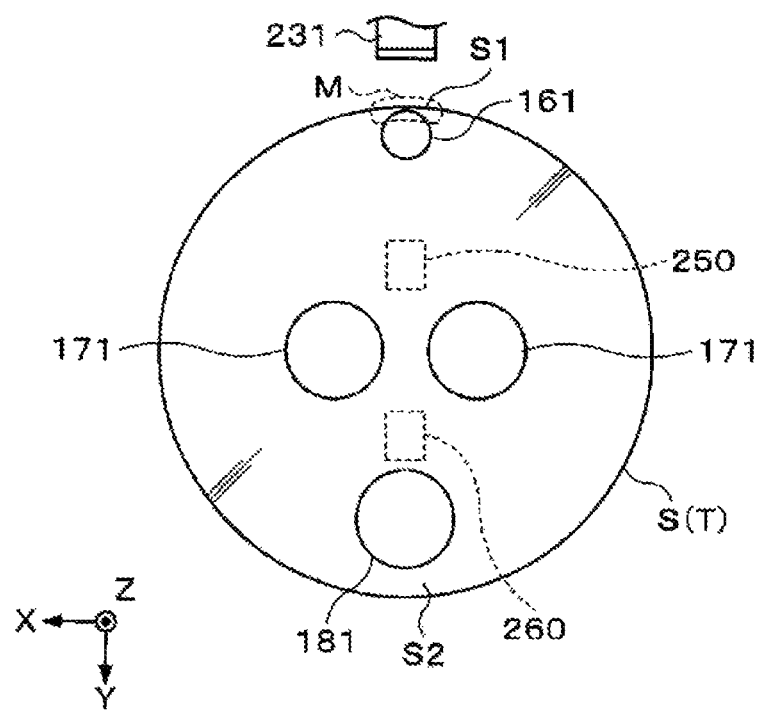
FIG. 12 is a plan view illustrating a positional relationship between a support wafer and suction pads of first to third suction moving units.

Next, the arrangement of the first to third suction moving units 160, 170 and 180 and the like will be described with reference to FIG. 12. FIG. 12 is a schematic plan view showing a positional relationship between the support wafer S, the suction pad 161 of the first suction moving unit 160, the suction pads 171 of the second suction moving units 170 and the suction pad 181 of the third suction moving unit 180.

As shown in FIG. 12, the suction pad 161 of the first suction moving unit 160 suction-holds the peripheral portion of the support wafer S adjacent to the one end S1 corresponding to the peeling initiation region M. In addition, the second suction moving units 170 are arranged and disposed at a plurality of places along the direction (i.e., the X direction) intersecting the direction (i.e., the Y direction) from the one end S1 of the support wafer S toward the other end S2 thereof. The suction pads 171 of the second suction moving units 170 suction-hold a region between the one end S1 and the other end S2 of the support wafer S, specifically, a region in the vicinity of the center of the support wafer S rather than the peripheral portion thereof adjacent to the one end S1. In addition, the suction pad 181 of the third suction moving unit 180 suction-holds the peripheral portion of the support wafer S adjacent to the other end S2.

The suction pads 171 and 181 are formed to have substantially the same suction area, while the suction pad 161 is formed to have a suction area smaller than those of the suction pads 171 and 181. If the suction pad 161 has a smaller suction area, only the peripheral portion of the support wafer S corresponding to the peeling initiation region M can be suction-held and raised. Therefore, it is possible to prevent an excessive force from being exerted on the peripheral portion in which the peeling initiation region M is not formed in the process of peeling off.

In addition, in some embodiments, the suction pad 161 may be formed smaller than a blade width of the sharp member 231 in the X direction, for example. Accordingly, it is possible to ensure that the suction pad 161 is prevented from suction-holding the peripheral portion of the support wafer S in which the peeling initiation region M is not formed. In other words, it is possible to accurately suction-hold only the peripheral portion of the support wafer S in which the peeling initiation region M is formed. In addition, the suction pads 171 and 181 each are formed to be larger than the blade width of the sharp member 231 in the X direction.

As shown in FIG. 12, the suction pads 161, 171 and 181 are disposed along the moving direction of the sharp member 231 (the Y direction). The peeling device 30 first pulls the suction pad 161 up prior to the suction pads 171 and 181, and then pulls the suction pads 171 up prior to the suction pad 181. That is, the peripheral portion of the support wafer S adjacent to the one end S1 is first raised, and the suction pads 171 and 181 are sequentially raised in this order. Accordingly, the peeling device 30 gradually and continuously peels off the support wafer S from the target wafer W from the one end S1 toward the other end S2 via the vicinity of the central portion.

As described above, the support wafer S is gradually peeled off from the target wafer W from the one end S1 toward the other end S2. However, for example, when the region of the support wafer S which is suction-held by the second suction moving units 170 is not yet peeled off from the target wafer W, if the second suction moving units 170 suction-hold and move the support wafer S in a direction in which the support wafer S is pulled up, an excessive load is applied to the second suction moving units 170, which, for example, may cause the suction pads 171 to be separated from the support wafer S. In addition, the same is true of the third suction moving unit 180 when the region of the support wafer S suction-held by the third suction moving unit 180 is not peeled off from the target wafer W.

Therefore, the peeling device 30 according to the first embodiment is provided with state detection units configured to detect a peeled-off state of the support wafer S from the target wafer W. The control unit 60 controls operation timings of the second and third suction moving units 170 and 180 so that the support wafer S is gradually peeled off from the target wafer W from the one end S1 toward the other end S2, based on the peeled-off state detected by the state detection units.

With this configuration, the operations of suction-holding the support wafer S by the second and third suction moving units 170 and 180 and moving the support wafer S in the direction away from the surface of the target wafer W can be performed at appropriate timings. Therefore, it is possible to prevent an excessive load from being applied to the second and third suction moving units 170 and 180.

Here, the state detection units will be described in detail. The state detection units are measurement units 250 and 260, which, for example, are installed at the upper base unit 190 to measure distances d1 and d2 from a predetermined measurement reference position to the support wafer S, as shown in FIG. 4. The measurement units 250 and 260 may include, e.g., laser displacement meters. Also, portions of the support wafer S corresponding to the positions in which the measurement units 250 and 260 are disposed are represented by broken lines in FIG. 12.

Although it has been described that the measurement units 250 and 260 include laser displacement meters as an example, the present disclosure is not limited thereto. For example, any suitable measuring mechanism may be used as long as the distances d1 and d2 from the predetermined measurement reference position to the support wafer S can be measured, such as capacitance sensors.

As shown in FIGS. 4 and 12, the measurement unit 250 is disposed in the vicinity of the second suction moving units 170 between the first suction moving unit 160 and the second suction moving units 170. Specifically, the measurement unit 250 is installed close to a position above the region of the support wafer S suction-held by the suction pads 171 of the second suction moving units 170.

The measurement unit 260 is disposed in the vicinity of the third suction moving unit 180 between the second suction moving units 170 and the third suction moving unit 180. Specifically, the measurement unit 260 is installed close to a position above the region of the support wafer S suction-held by the suction pad 181 of the third suction moving unit 180. The measurement results from the measurement units 250 and 260 are transmitted to the control unit 60.

The control unit 60 determines whether or not the region of the support wafer S suction-held by the second suction moving units 170 or the third suction moving unit 180 has been peeled off from the target wafer W, based on the measurement results of the measurement units 250 and 260.

Specifically, when after the first suction moving unit 160 moves the support wafer S in the direction away from the target wafer W, the distance d1 measured by the measurement unit 250 is equal to or larger than a threshold value D1, the control unit 60 determines that the region of the support wafer S suction-held by the second suction moving units 170 is not yet peeled off from the target wafer W. In addition, when the process of peeling off of the support wafer S progresses and the distance d1 is less than the threshold value D1, the control unit 60 determines that the support wafer S has been peeled off up to a predetermined position between the peripheral portion adjacent to the one end S1 and the region in the vicinity of the central portion. Specifically, the control unit 60 may determine that the region of the support wafer S suction-held by the second suction moving units 170 has been peeled off from the target wafer W. The threshold value D1 corresponds to the distance d1 when the region of the support wafer S suction-held by the second suction moving units 170 is peeled off from the target wafer W.

Then, when the control unit 60 determines that the above-described region has been peeled off form the target wafer W, the control unit 60 operates the second suction moving units 170 suction-holding the region to suction-hold the support wafer S and to move the support wafer S in the direction away from the surface of the target wafer W. Accordingly, it is possible to prevent an excessive load from being applied to the second suction moving units 170.

In the same way, after the second suction moving units 170 move the support wafer S in the direction away from the target wafer W, the distance d2 measured by the measurement unit 260 is equal to or larger than a threshold value D2, the control unit 60 determines that the region of the support wafer S suction-held by the third suction moving unit 180 is not yet peeled off from the target wafer W. Then, when the process of peeling off of the support wafer S progresses and the distance d2 is less than the threshold value D2, the control unit 60 determines that the support wafer S has been peeled off up to a predetermined position between the region in the vicinity of the central portion and the peripheral portion adjacent to the other end S2. Specifically, the control unit 60 may determine that the region of the support wafer S suction-held by the third suction moving unit 180 has been peeled off from the target wafer W. The threshold value D2 corresponds to the distance d2 when the region of the support wafer S suction-held by the third suction moving unit 180 is peeled off from the target wafer W.

Then, if it is determined that the region suction-held by the third suction moving unit 180 has been peeled off from the target wafer W, the control unit 60 operates the third suction moving unit 180 suction-holding the region to move the support wafer S in the direction away from the surface of the target wafer W. Accordingly, it is possible to prevent an excessive load from being applied to the third suction moving unit 180.

Figure 13:
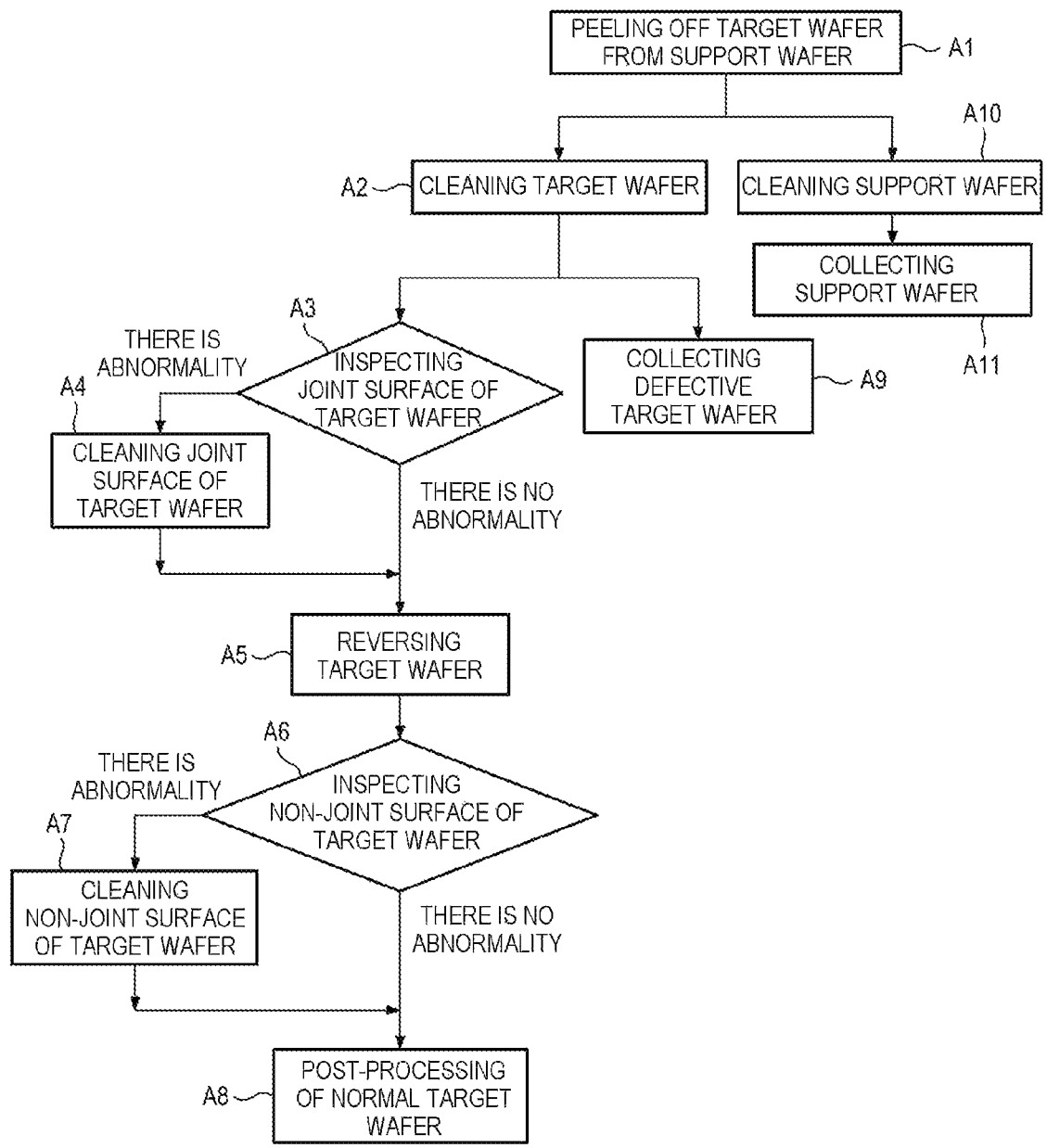
FIG. 13 is a flowchart illustrating main steps of a peeling process in the peeling system.

Next, a peeling method for separating the target wafer W from the support wafer S using the peeling system 1 configured as described above will be described. FIG. 13 is a flowchart illustrating an example of main steps of such peeling process.

First, a cassette $C_T$ accommodating the plurality of superposed wafers T, an empty cassette $C_W$, and an empty cassette $C_S$ are mounted on a predetermined cassette mounting plate 11 of the carry-in/carry-out station 2. The superposed wafer T in the cassette $C_T$ is taken out by the first transfer device 20 and transferred to the standby device 12. At this time, the superposed wafer T is held by the dicing frame F and the dicing tape P and transferred in a state in which the target wafer W is disposed on the lower side and the support wafer S is disposed on the upper side.

In the standby device 12, an ID reading process of reading ID of the dicing frame F by an ID reading mechanism is performed. The ID read by the ID reading mechanism is transmitted to the control unit 60. Also, in the standby device 12, an orientation of the superposed wafer T is adjusted while a position of a notch of the superposed wafer T is being detected by the position adjustment mechanism. Further, when a superposed wafer T should wait for the processing, for example, due to a difference of the processing time between the devices or the like, the superposed wafer T may be put into a temporary standby state in the standby device 12, thereby saving the loss time between a series of steps.

Thereafter, the superposed wafer T is transferred to the edge cut device 33 of the peeling station 3 by the first transfer device 20. In the edge cut device 33, the peripheral portion of the adhesive G is dissolved by a solvent by immersing the superposed wafer T in the solvent of the adhesive G. The peripheral portion of the adhesive G is removed by such an edge cutting process, which makes it is easier to peel off the target wafer W from the support wafer S in the peeling process to be described later. Thus, it is possible to reduce a time required for the peeling process.

Thereafter, the superposed wafer T is transferred to the peeling device 30 by the first transfer device 20. In the peeling device 30, the superposed wafer T is peeled-off into the target wafer W and the support wafer S (step A1 of FIG. 13). In addition, the details of the peeling process of the superposed wafer T will be described later.

Thereafter, the peeled-off target wafer W is transferred to the first cleaning device 31 by the first transfer device 20. Further, the target wafer W carried out of the peeling device 30 and carried into the first cleaning device 31 is held on the dicing frame F and the dicing tape P. Further, in the first cleaning device 31, the joint surface $W_J$ of the peeled-off target wafer W is cleaned (step A2 of FIG. 13). By such a cleaning process, the adhesive G remaining on the joint surface $W_J$ of the target wafer W is removed.

Here, a process of inspection is performed in advance on the plurality of superposed wafers T carried into the carry-in/carry-out station 2 as described above, and the plurality of the superposed wafers T is discriminated into a superposed wafer T including a normal target wafer W and a superposed wafer T including a defective target wafer W.

After the joint surface $W_J$ is cleaned in step A2, the normal target wafer W peeled-off from the normal superposed wafer T is transferred to the inspection device 7 by the third transfer device 51. In the inspection device 7, the joint surface $W_J$ of the target wafer W is imaged, and the presence or absence of the residue of the adhesive G in the joint surface $W_J$ is inspected (step A3 in FIG. 13).

After the residue of the adhesive G is found in the inspection device 7, the target wafer W is transferred to the joint surface cleaning device 40 of the post-inspection cleaning station 8 by the third transfer device 51, and the joint surface $W_J$ is cleaned in the joint surface cleaning device 40 (step A4 of FIG. 13). When the joint surface $W_J$ is cleaned, the target wafer W is transferred to the reversing device 42 by the third transfer device 51, and the front and back sides of the target wafer W are reversed in the reversing device 42 (step A5 of FIG. 13). Further, in a case in which the residue of the adhesive G is not found in the inspection device 7, the target wafer W is reversed in the reversing device 42 without being transferred to the joint surface cleaning device 40.

Thereafter, the reversed target wafer W is transferred to the inspection device 7 again by the third transfer device 51 and the non-joint surface $W_N$ is inspected (step A6 in FIG. 13). Further, when the residue of the adhesive G is found in the non-joint surface $W_N$, the target wafer W is transferred to the non-joint surface cleaning device 41 by the third transfer device 51 and the non-joint surface $W_N$ is cleaned (A7 step of FIG. 13). Next, the cleaned target wafer W is transferred to the post-processing station 4 by the third transfer device 51. Further, in a case in which the residue of the adhesive G is not found in the inspection device 7, the target wafer W is directly transferred to the post-processing station 4 without being transferred to the non-joint surface cleaning device 41.

Thereafter, a predetermined post-processing is performed on the target wafer W in the post-processing station 4 (step A8 of FIG. 13). In this way, the target wafer W is manufactured into products.

Meanwhile, after the joint surface $W_J$ is cleaned in step A2, the defective target wafer W peeled-off from the defective superposed wafer T is transferred to the carry-in/carry-out station 2 by the first transfer device 20. Thereafter, the defective target wafer W is carried to the outside from the carry-in/carry-out station 2 to be collected (step A9 of FIG. 13).

While the above-described steps A2 to A9 are performed on the target wafer W, the support wafer S peeled-off in the peeling device 30 is transferred to the second cleaning device 32 by the second transfer device 34. Here, the peeled-off support wafer S is in a state in which the upper surface side, i.e., the non-joint surface $S_N$ side, is held by the second holding unit 150 of the peeling device 30, while the second transfer device 34 holds the joint surface $S_J$ side of the support wafer S from the bottom in a non-contact manner. Further, the second transfer device 34 carries the support wafer S into the second cleaning device 32, with holding the same thereon, and thereafter reverses the support wafer S upside down. Thus, the support wafer S is mounted in a state in which the joint surface $S_J$ faces upward. Further, in the second cleaning device 32, the joint surface $S_J$ of the support wafer S is cleaned (step A10 of FIG. 13). With such a cleaning process, the adhesive G remaining on the joint surface $S_J$ of the support wafer S is removed.

Thereafter, the support wafer S, in which the joint surfaces $S_J$ is cleaned, is transferred to the carry-in/carry-out station 2 by the first transfer device 20. Thereafter, the support wafer S is carried to the outside from the carry-in/carry-out station 2 to be collected (step A11 of FIG. 13). In this way, a series of processes for separation of the target wafers W and the support wafers S is completed.

Figure 14:
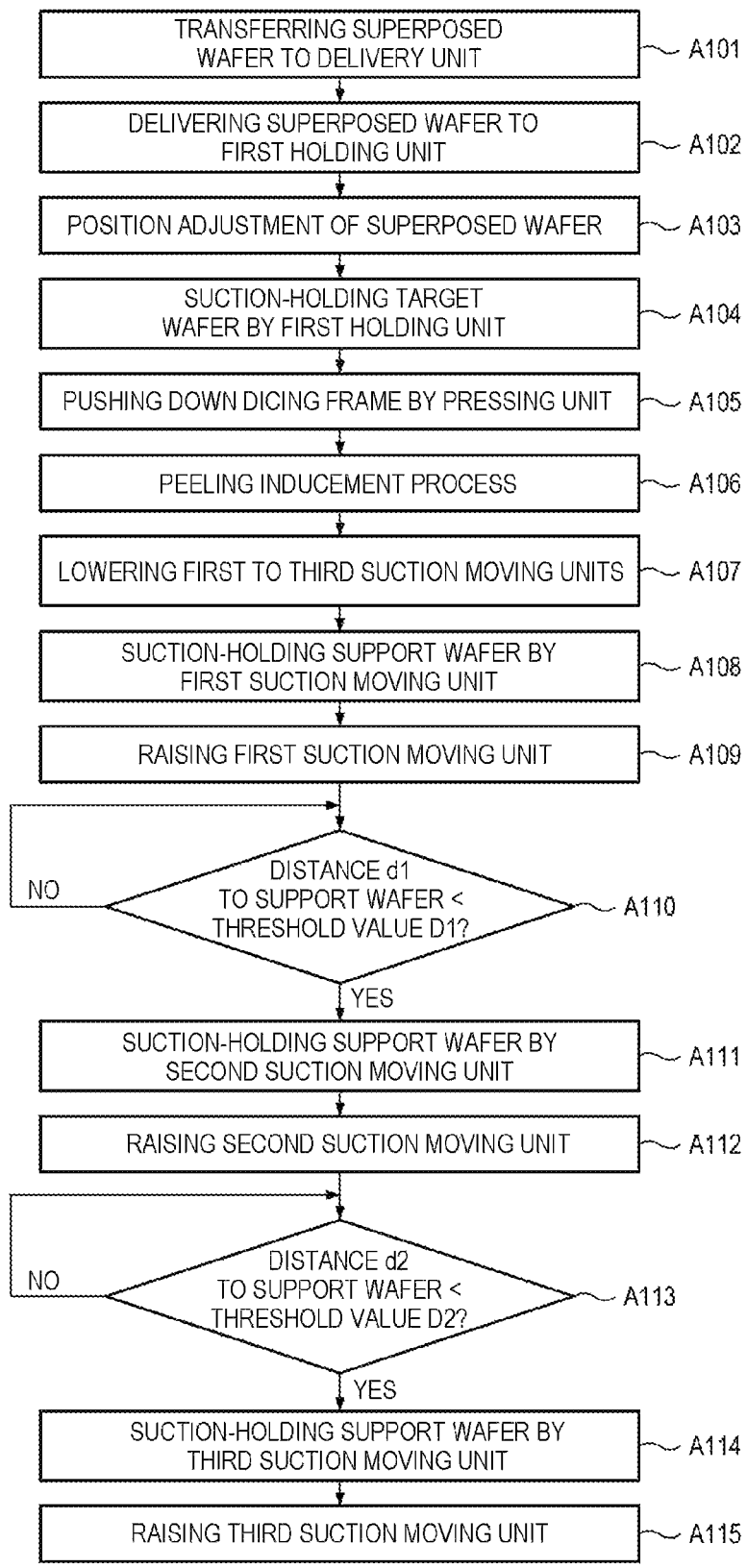
FIG. 14 is a flowchart illustrating main steps of a peeling process in the peeling device.

Next, the peeling method of separating the target wafer W from the support wafer S in the above-described step A1 will be described. FIG. 14 is a flowchart illustrating an example of main steps of such a peeling process.

Figure 15:
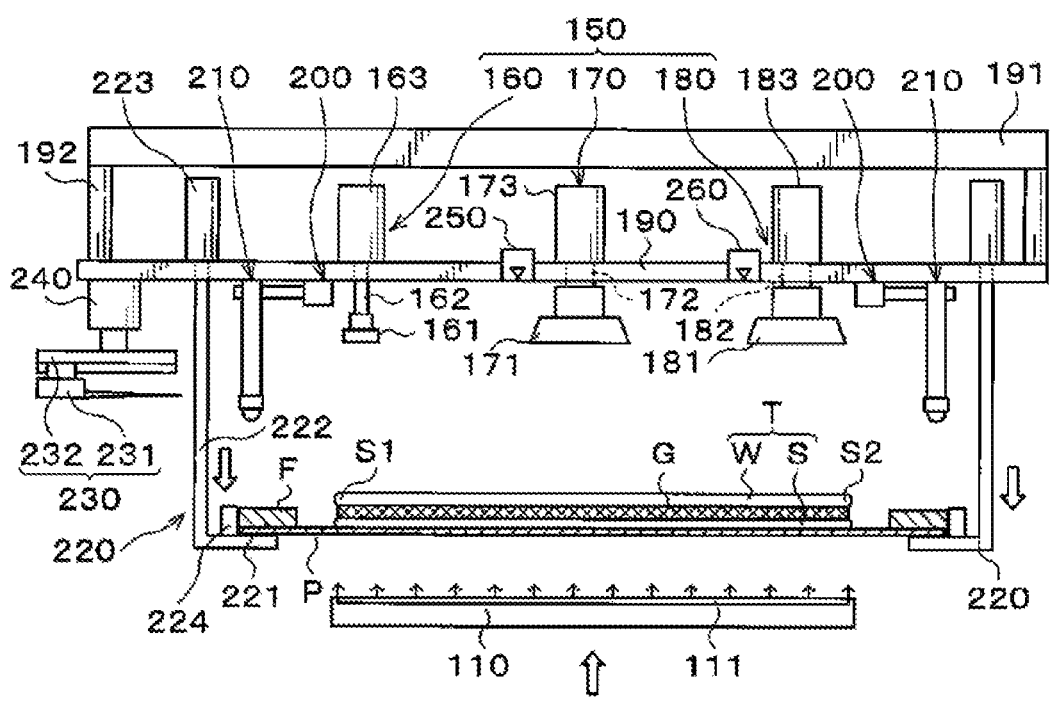
FIG. 15 is an explanatory view of a peeling operation by the peeling device.

First, the superposed wafer T carried into the peeling device 30 by the first transfer device 20 is transferred to the delivery unit 220 waiting for the same (step A101 of FIG. 14), as illustrated in FIG. 15. A position of the superposed wafer T delivered to the delivery unit 220 is adjusted by the guide unit 224 so as to be positioned at a predetermined position relative to the first holding unit 110. Further, at this time, the first holding unit 110 is positioned below the delivery unit 220. Further, in the first holding unit 110, a gas is supplied to the suction surface 111a from a gas supply source 116 and is ejected from the suction surface 111a in order to prevent the plurality of holes in the suction surface 111a from being closed.

Figure 16:
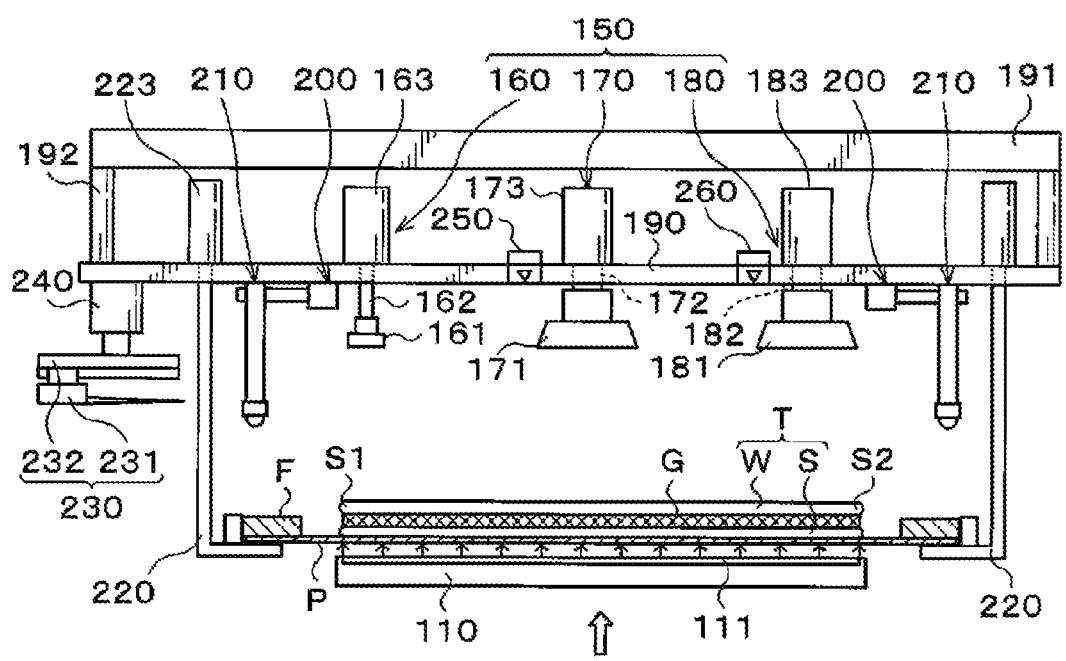
FIG. 16 is an explanatory view of a peeling operation by the peeling device.

Thereafter, as illustrated in FIG. 16, the first holding unit 110 is raised, and the superposed wafer T is delivered to the first holding unit 110 from the delivery unit 220 (step A102 of FIG. 14). At this time, the gas is ejected from the suction surface 111a of the first holding unit 110, and the superposed wafer T is held in the first holding unit 110 in a state of floating from the first holding unit 110. Further, a gap between the superposed wafer T and the suction surface 111a is small, and the superposed wafer T is appropriately held on the first holding unit 110.

Figure 17:
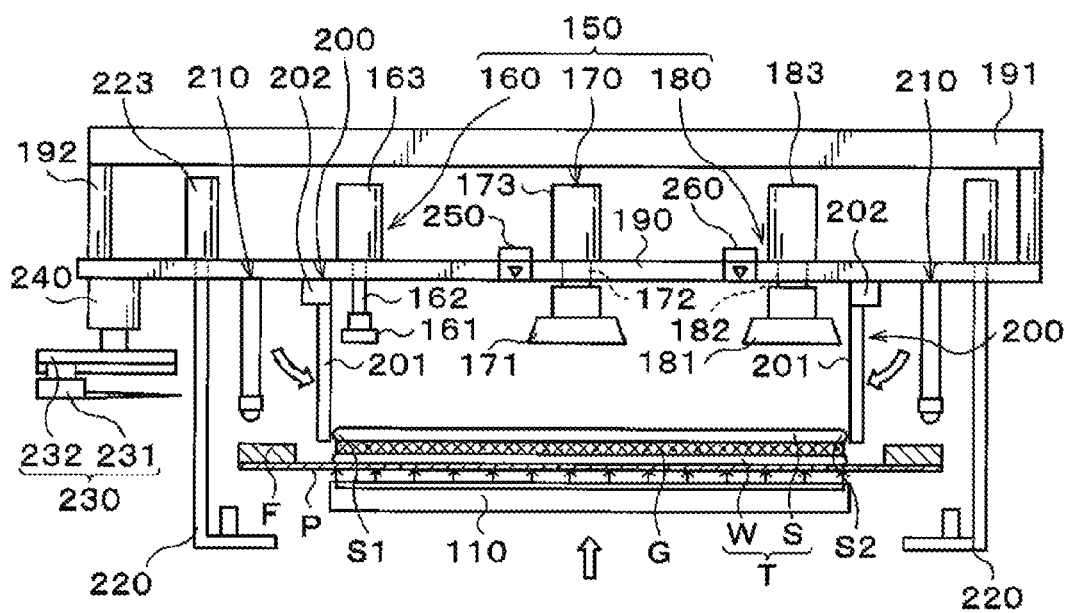
FIG. 17 is an explanatory view of a peeling operation by the peeling device.

Thereafter, as illustrated in FIG. 17, the first holding unit 110 is further raised, and the superposed wafer T held on the first holding unit 110 is adjusted to a predetermined position by the position adjustment unit 200 (step A103 of FIG. 14). Specifically, the arm unit 201 is rotate by the rotational movement mechanism 202. At this time, since the arm unit 201 has an appropriate longitudinal length, the rotating arm unit 201 does not interfere with the dicing frame F. When the arm units 201 of the position adjustment unit 200 are rotationally moved by the rotational movement mechanism 202, respectively, the leading end portion of the arm unit 201 come into contact with the side surface of the support wafer S. Thus, a position of the superposed wafer T is adjusted to a predetermined position. Further, since the arm unit 201 comes into contact with the side surface of the support wafer S, the target wafer W to be into the product is not damaged.

Further, continued from step A102, the gas is ejected from the suction surface 111a of the first holding unit 110, and the superposed wafer T floats from the first holding unit 110 in step A103. In this case, the superposed wafer T is easily moved, which makes it possible to smoothly perform the position adjustment of the superposed wafer T by the position adjustment unit 200.

Thereafter, the valve 114 of the first holding unit 110 is switched to stop the supply of the gas from the gas supply source 116 and the suction of the suction surface 111a by the suction device 115 is started. Further, as illustrated in FIG. 18, the target wafer W is suction-held through the dicing tape P by the first holding unit 110 (step A104 of FIG. 14).

Figure 18:
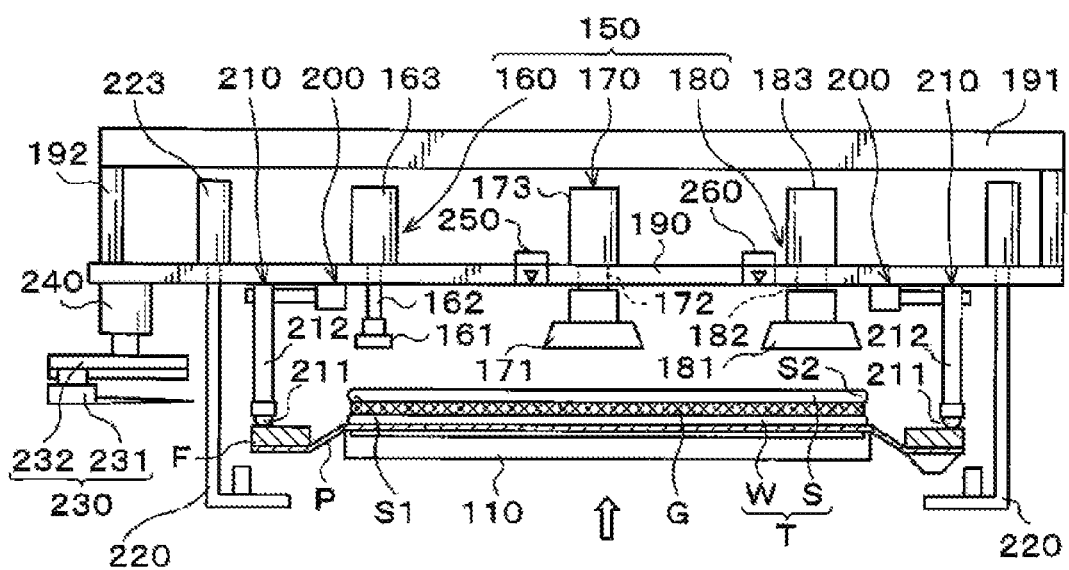
FIG. 18 is an explanatory view of a peeling operation by the peeling device.

Thereafter, as illustrated in FIG. 18, the first holding unit 110 is further raised, and the superposed wafer T held by the first holding unit 110 is placed at a predetermined position for the peeling process. At this time, the dicing frame F is pushed vertically downward with respect to the superposed wafer T by the pressing unit 210 (step A105 of FIG. 14). Thus, on the side surface of the superposed wafer T, a space into which the peeling inducement unit 230 can burrow is formed.

Figure 19:
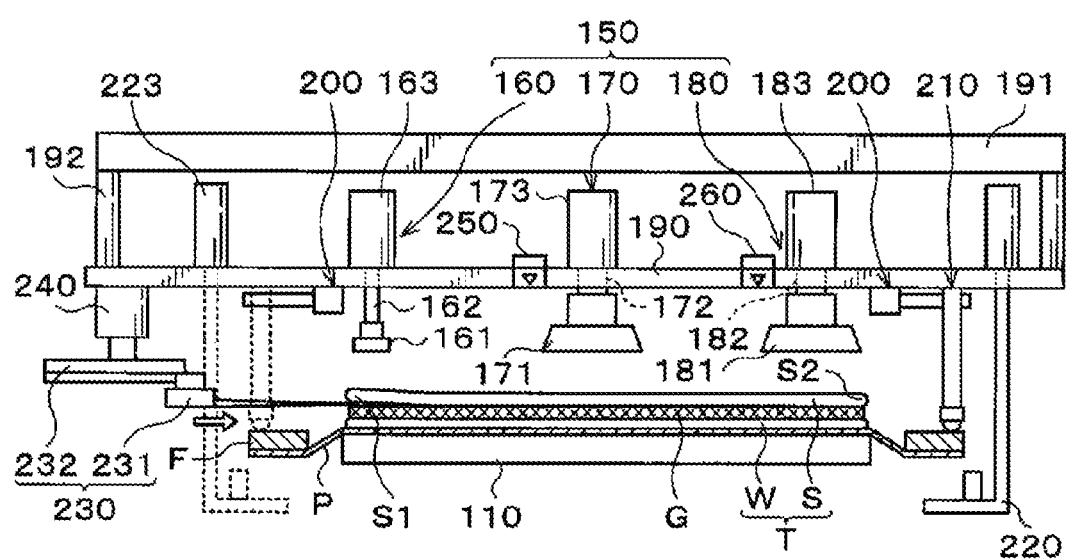
FIG. 19 is an explanatory view of a peeling operation by the peeling device.

Thereafter, as illustrated in FIG. 19, the peeling inducement process described with reference to FIGS. 9 to 11 is performed, while allowing the peeling inducement unit 230 to be located in the above-described space (step A106 of FIG. 14). Accordingly, the peeling initiation region M (see FIG. 10) is formed on the side surface of one end S1 of the superposed wafer T.

Further, as described above, for example, when adhesive force between the support wafer S and the adhesive G is relatively strong, the rotation mechanism 130 may be further rotated in the process of step A106, and the first holding unit 110 may be rotated around the vertical axis, for example by 360 degrees. Thus, the peeling initiation region M is formed over the entire circumference of the joint surface $S_J$ of the support wafer S, which makes it possible to easily peel off the support wafer S from the target wafer W.

Figure 20:
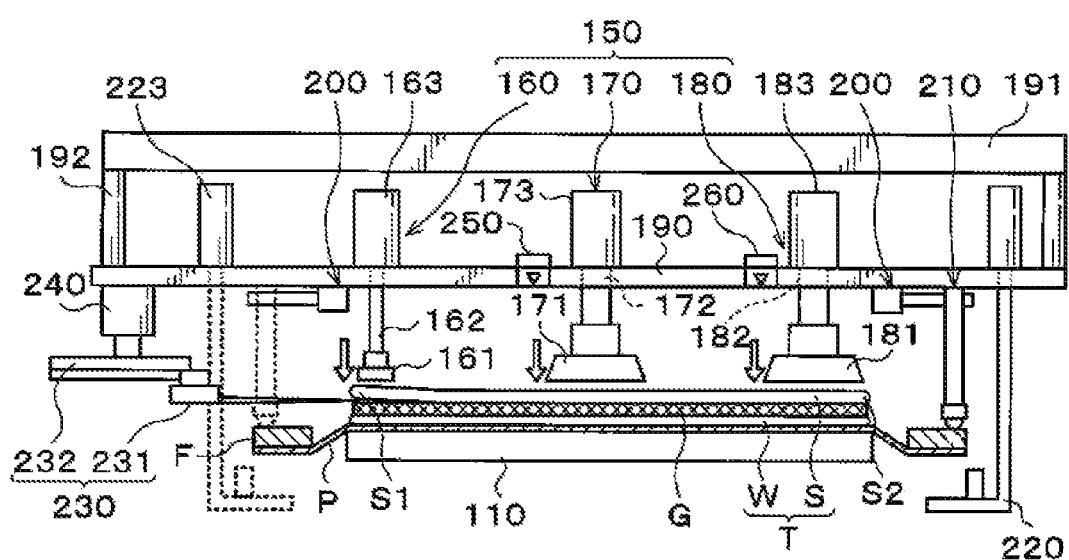
FIG. 20 is an explanatory view of a peeling operation by the peeling device.

Thereafter, as illustrated in FIG. 20, the suction pads 161, 171, and 181 of the first to third suction moving units 160, 170, and 180 are lowered to be in vicinity of the support wafer S (step A107 of FIG. 14).

Figure 21:
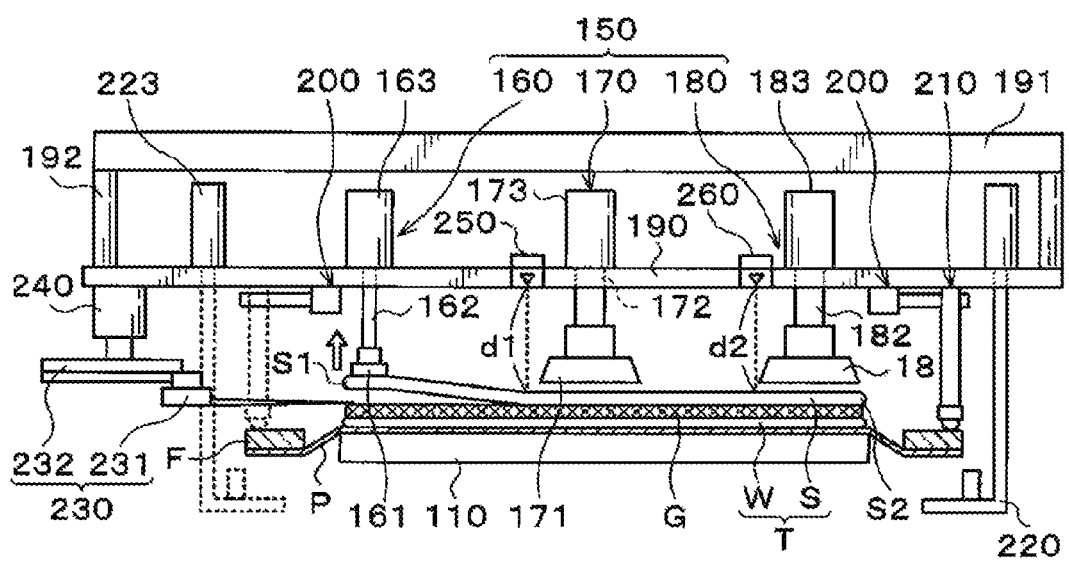
FIG. 21 is an explanatory view of a peeling operation by the peeling device.

Thereafter, as illustrated in FIG. 21, the non-joint surface $S_N$ of the support wafer S is suction-held using the first suction moving unit 160 (step A108 of FIG. 14). As described above, the first suction moving unit 160 suction-holds the peripheral portion of the one end S1 of the support wafer S corresponding to the peeling initiation region M.

Next, the suction pad 161 of the first suction moving unit 160 is raised (step A109 of FIG. 14). That is, the peripheral portion of the one end S1 of the support wafer S corresponding to the peeling initiation region M is pulled. Thus, the support wafer S begins to be continuously peeled off from the target wafer W toward the central portion from the peripheral portion.

Further, it is determined whether the distance d1 from a predetermined measurement reference position to the support wafer S measured by the measurement unit 250 is less than the threshold value D1 (step A110 of FIG. 14). When the distance d1 is equal to or greater than the threshold value D1 (step A110 of FIG. 14, NO), it is determined that a region of the support wafer S suction-held by the second suction moving unit 170 is not peeled-off from the target wafer W yet, and the process of step A110 is repeated.

Figure 22:
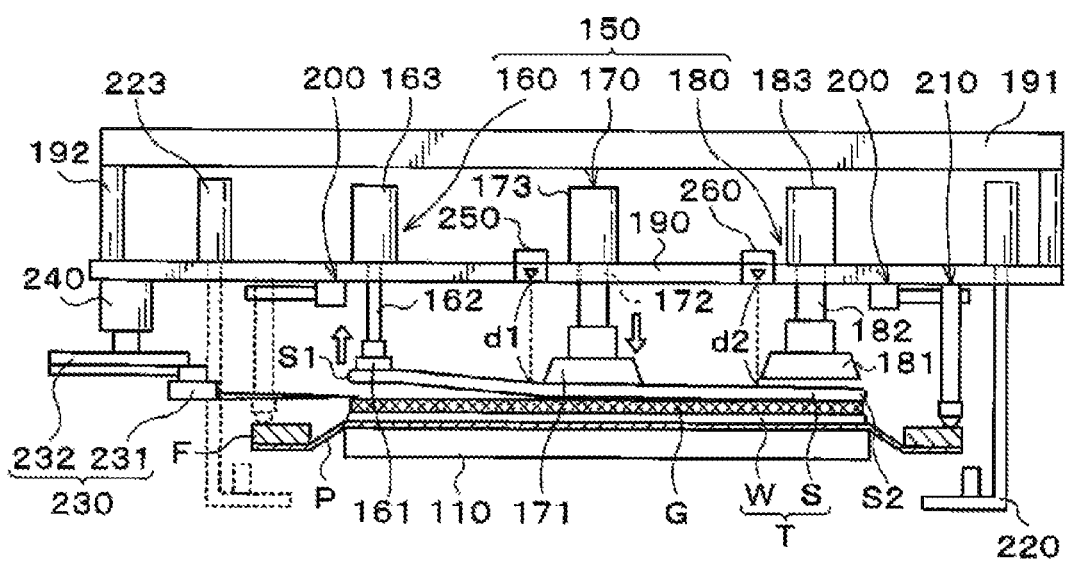
FIG. 22 is an explanatory view of a peeling operation by the peeling device.

Meanwhile, when the distance d1 is less than the threshold value D1 (step A110 of FIG. 14, YES), it is determined that a region of the support wafer S suction-held by the second suction moving unit 170 is peeled-off from the target wafer W. Further, as illustrated in FIG. 22, the second suction moving unit 170 is lowered, and the non-joint surface $S_N$ of the support wafer S is suction-held using the second suction moving unit 170 (step A111 of FIG. 14). As described above, the second suction moving unit 170 suction-holds the region closer to the central portion rather than the peripheral portion of the one end S1 of the support wafer S.

Figure 23:
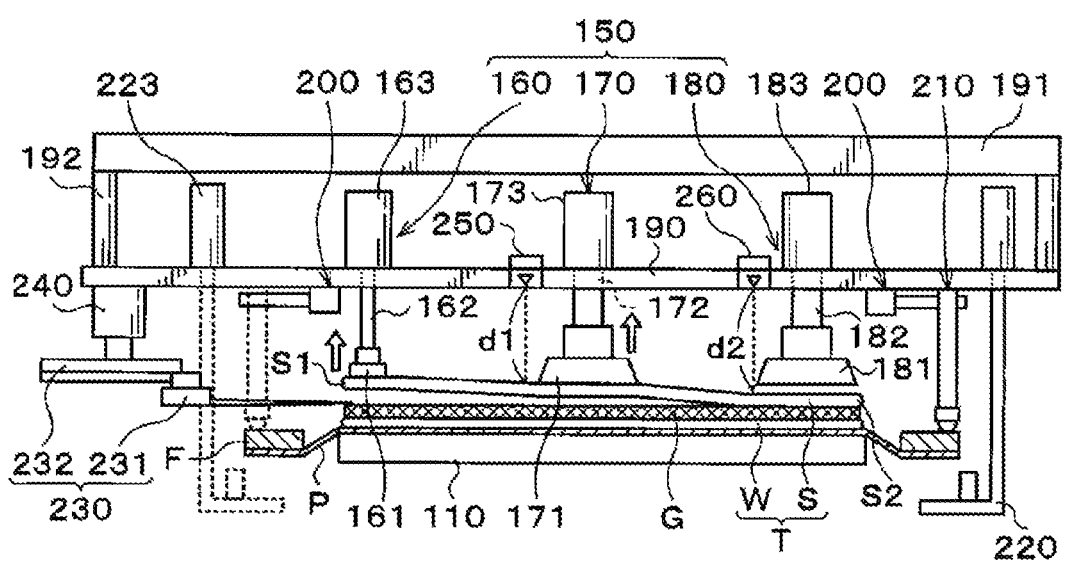
FIG. 23 is an explanatory view of a peeling operation by the peeling device.

Thereafter, as illustrated in FIG. 23, the suction pad 171 of the second suction moving unit 170 is raised (step A112 of FIG. 14). That is, the vicinity of the central portion of the support wafer S is further pulled while the peripheral portion of one end S1 of the support wafer S is being pulled.

Next, it is determined whether the distance d2 from a predetermined measurement reference position to the support wafer S measured by the measurement unit 260 is less than the threshold value D2 (step A113 of FIG. 14). When the distance d2 is equal to or greater than the threshold value D2 (step A113 of FIG. 14, NO), it is determined that the region of the support wafer S suction-held by the third suction moving unit 180 is not peeled-off from the target wafer W yet, and the process of step A113 is repeated.

Figure 24:
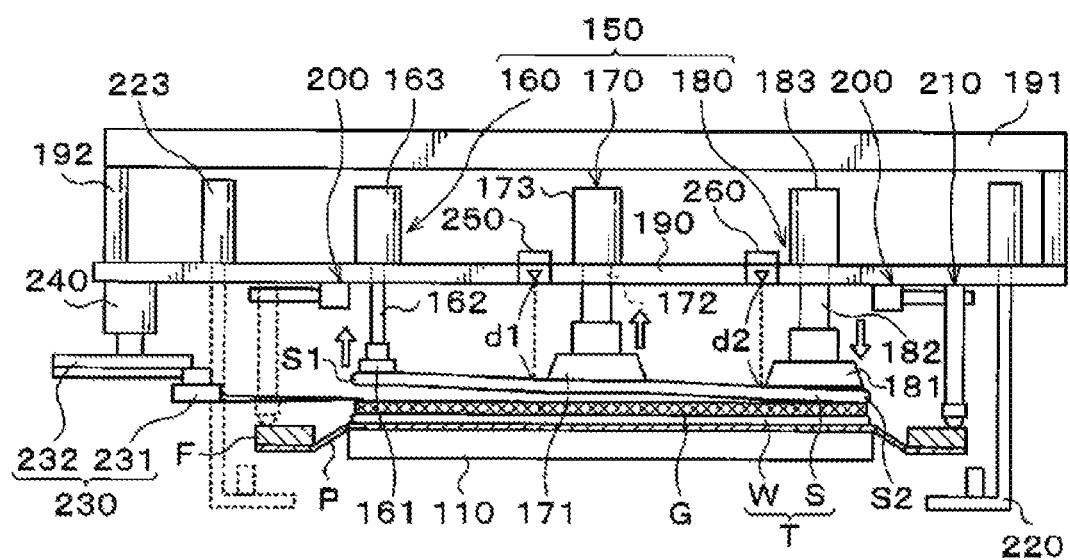
FIG. 24 is an explanatory view of a peeling operation by the peeling device.

Meanwhile, when the distance d2 is less than the threshold value D2 (step A113 of FIG. 14, Yes), it is determined that the region of the support wafer S suction-held by the third suction moving unit 180 is peeled-off from the target wafer W. Further, as illustrated in FIG. 24, the third suction moving unit 180 is lowered, and the non-joint surface $S_N$ of the support wafer S is suction-held using the third suction moving unit 180 (step A114 of FIG. 14). As described above, the third suction moving unit 180 suction-holds the peripheral portion of the other end S2 of the support wafer S.

Thereafter, the suction pad 181 of the third suction moving unit 180 is raised (step A115 of FIG. 14). That is, the peeling device 30 further pulls the peripheral portion of the other end S2 of the support wafer S, while pulling the peripheral portion of the one end S1 of the support wafer S and the vicinity of the central portion of the support wafer S. Thus, the support wafer S is peeled-off from the target wafer W.

Figure 25:
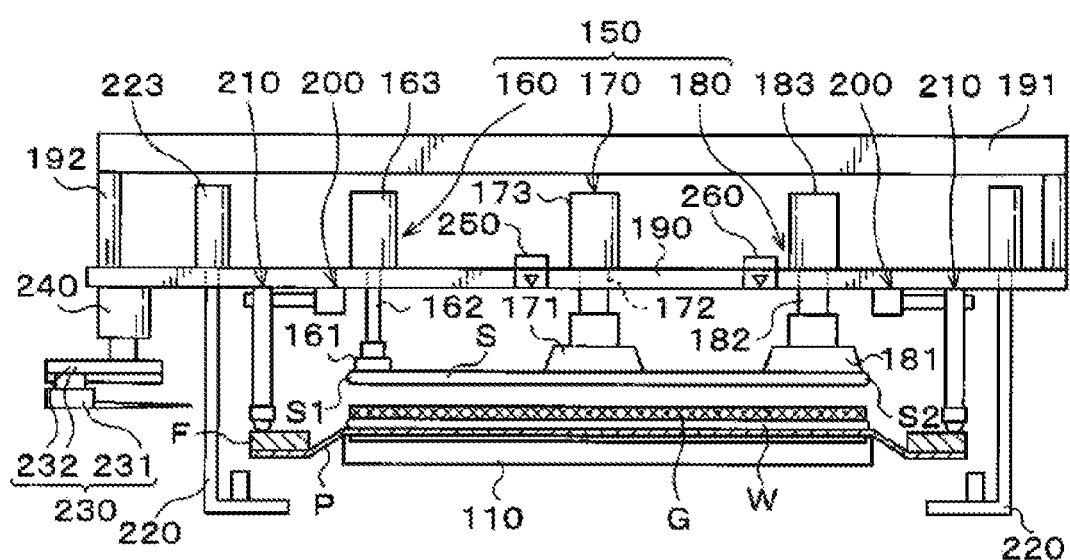
FIG. 25 is an explanatory view of a peeling operation by the peeling device.

Thereafter, as illustrated in FIG. 25, the support wafer S is horizontally placed by raising only the second and third suction moving units 170 and 180 or by lowering only the first and second suction moving units 160 and 170, and the sharp member 231 retreats. In this way, a series of the peeling processes of the target wafers W and support wafers S in the peeling device 30 is completed.

According to the above-described embodiment, after holding the superposed wafer T in the first holding unit 110 in step A102, the arm unit 201 of the position adjustment unit 200 is brought into contact with the side surface of the support wafer S of the superposed wafer T in step A103, and thus, it is possible to perform the position adjustment of the superposed wafer T in the first holding unit 110. Since the superposed wafer T is held at an appropriate position relative to the first holding unit 110 in this manner, it is possible to appropriately peel the superposed wafer T into the target wafer W and the support wafer S.

Here, it is also conceivable to achieve the position adjustment of the superposed wafer through a positioning of the dicing frame in the peeling process of the superposed wafer held on the dicing frame. However, sometimes, a position of the superposed wafer with respect to the dicing frame may vary, since the superposed wafer cannot be appropriately mounted on the dicing tape. In addition, in some cases, a dimensional accuracy of the dicing frame itself may also vary. In such cases, the adjustment through the positioning of the dicing frame, does not always guarantee a successful position adjustment of the superposed wafer held by the dicing frame, and the accuracy of the position adjustment of the superposed wafer decreases.

In this regard, the position adjustment of the superposed wafer T according to the present embodiment where the arm units 201 of the position adjustment unit 200 come into contact with the side surface (side surface of the support wafer S) of the superposed wafer T in step A103 for the position adjustment of the superposed wafer T itself, has an advantage in that an accurate adjustment of the position of the superposed wafer T is possible.

Also, when performing the position adjustment of the superposed wafer T in step A103, since the support wafer S is contacted with the arm units 201 on its side, it is possible to suppress the target wafer W that will be a product from suffering any damage.

Also, when performing the position adjustment of the superposed wafer T in step A103, since the gas is ejected from the suction surface 111a of the first holding unit 110 to float the superposed wafer T floats from the first holding unit 110, the superposed wafer T is easily moved. Therefore, it is possible to smoothly adjust the position of the superposed wafer T by the position adjustment unit 200.

Further, when the superposed wafer T is delivered to the delivery unit 220 in step A101, the position adjustment of the superposed wafer T relative to the first holding unit 110 is performed by the guide unit 224. Accordingly, since the position adjustment is also performed in step A101 in addition to the position adjustment in step A103 in this manner, it is possible to more appropriately perform the position adjustment of the superposed wafer T relative to the first holding unit 110.

Further, according to the peeling system 1 of the embodiment described above, after peeling the superposed wafer T into the target wafer W and the support wafer S in the peeling device 30, the peeled-off target wafer W can be cleaned in the first cleaning device 31, and the peeled-off support wafer S can be cleaned in the second cleaning device 32. According to this embodiment as described above, it is possible to efficiently perform a series of processes from the peeling process of peeling off the target wafer W from the support wafer S to the cleaning processes of cleaning the target wafer W and the support wafer S within the peeling system 1. Further, it is possible to perform the cleaning of the target wafer W and the cleaning of the support wafer S in parallel in the first cleaning device 31 and the second cleaning device 32, respectively. Further, it is also possible to process target wafers W and support wafers S in the first cleaning device 31 and the second cleaning device 32, respectively, while concurrently performing the peeling of the target wafer W and the support wafer S in the peeling device 30. Therefore, it is possible to efficiently perform the peeling of the target wafer W and the support wafer S, thereby improving the throughput of the peeling process.

Further, since a post-processing of the target wafer W can be performed as well as the process of peeling off the target wafer W from the support wafer S in the series of processes, it is possible to further improve the throughput of the wafer processing.

Further, in the peeling device 30 according to the embodiment described above, the sharp member 231 of the peeling inducement unit 230 may be configured to be attachable to or detachable from the movement mechanism 232. As the sharp member 231, it is preferable to properly use various members depending on the conditions of the superposed wafer T to be peeled-off, for example, a material, a thickness or the like of the adhesive G. For example, the sharp member 231 may be a guillotine cut type member and may be a thin blade having a thickness of 0.25 mm to 0.5 mm. In either case, as far as it is attachable or detachable, it can be selected as an appropriate sharp member 231, whereby the peeling process can be more appropriately performed.

Figure 26:
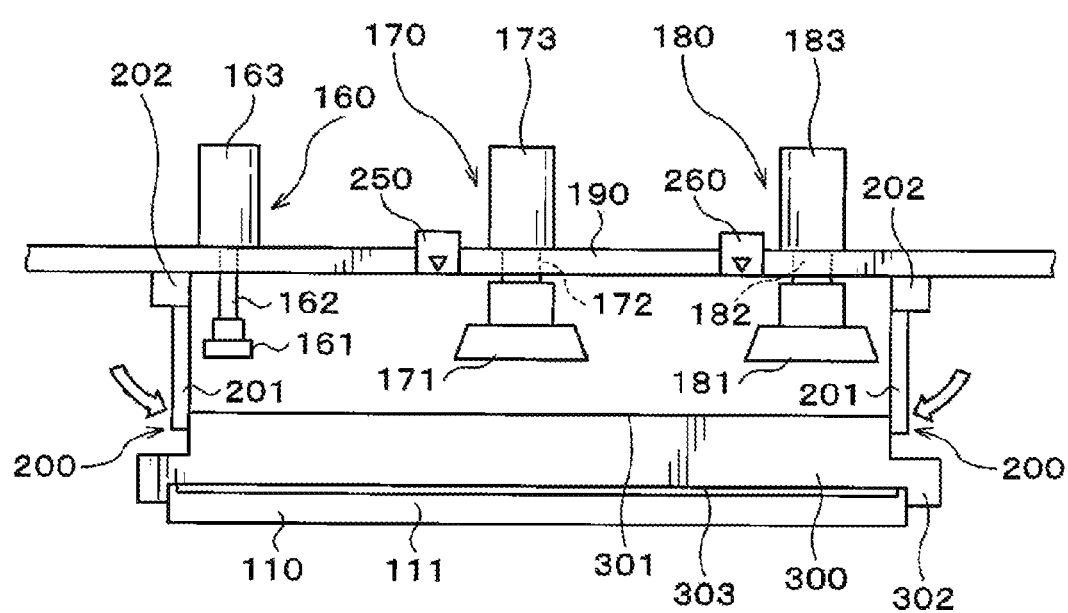
FIG. 26 is an explanatory view illustrating an aspect of adjusting a position adjustment unit by a jig.

In the peeling device 30 of the above-described embodiment, a rectification of the position adjustment unit 200 can be performed, for example, using a jig 300 illustrated in FIG. 26. The jig 300 has a rectification unit 301 and a positioning unit 302.

The rectification unit 301 has the same shape as the superposed wafer T (support wafer S) in a plan view. Further, the rectification unit 301 is configured such that when the jig 300 is mounted on the first holding unit 110, a surface height of the rectification unit 301 becomes the same height as that of the superposed wafer T.

An outward form of the positioning unit 302 is greater than an outer diameter of the first holding unit 110. Further, a recess 303 into which an outward form of the first holding unit 110 is fitted is formed on the lower surface of the positioning unit 302. In this case, when the jig 300 is mounted on the first holding unit 110, there is no need to match the center of the jig 300 and the center of the first holding unit 110 by using a separate means. Further, the first holding unit 110 is fitted into the recess 303, and the jig 300 is held at an appropriate position of the first holding unit 110.

In this case, in a same way as in the position adjustment of the superposed wafer T by the position adjustment unit 200 in step A103, the arm unit 201 is rotated by the rotational movement mechanism 202 to come into contact with the side surface of the rectification unit 301 while the jig 300 is held by the first holding unit 110. This position of the arm unit 201 is set to a reference value, and the position of the arm unit 201 is appropriately rectified. By periodically performing the rectification of the position adjustment unit 200 by the jig 300 in this way, it is possible to more appropriately perform the position adjustment of the superposed wafer T in step A103 and more appropriately perform the peeling process of the superposed wafer T.

Further, the method of adjusting the position of the superposed wafer T of the present disclosure can be applied without being limited to the case in which the superposed wafer T held on the dicing frame F is peeled-off at room temperature in the peeling device 30 as in the above embodiment. For example, the present disclosure can be applied even in a case of performing the position adjustment of the superposed wafer T when the superposed wafer T held on the dicing frame F is peeled-off by heating. Further, the present disclosure can be applied even in a case of performing the position adjustment of the superposed wafer T, for example, when peeling the superposed wafers T that is not held on the dicing frame.

In the above-described embodiment, a case of performing the post-processing on the target wafer W to make into a product in the post-processing station 4 was described, but the present disclosure can also be applied to, for example, a case of peeling off a target wafer for use in a three-dimensional integration technology from the support wafer. Further, the three-dimensional integration technology is, as a technology for the demand for high integration of semi-conductor devices in recent years, a technology of laminating a plurality of semiconductor devices in a three-dimensional manner instead of disposing a plurality of highly integrated semiconductor devices in a horizontal plane. In this three-dimensional integration technology, since thinning of the target wafer to be laminated is required, a predetermined processing is performed on the target wafer joined to the support wafer.

In the above-described embodiment, a case of peeling the superposed wafer T joined with the adhesive G into target wafer W and the support wafer S has been described, but the present disclosure may be used for the peeling process of other superposed wafers T. For example, the target wafer W may be a silicon-on-insulator (SOI) wafer. For example, an insulating film made of $SiO_2$ may be formed on the target wafer W.

In this case, a heat treatment device (not illustrated) configured to perform the heat treatment of the superposed wafer T may be installed in the peeling system 1. Further, after the superposed wafer T is heat-treated to a predetermined temperature by the heat treatment device, the superposed wafer T is peeled into the target wafer W and the support wafer S in the peeling device 30. Further, in this embodiment, the first cleaning device 31 configured to clean the peeled-off target wafer W and the second cleaning device 32 configured to clean the peeled-off support wafer S may be omitted.

Further, the configuration of the peeling system 1 described above may be arbitrarily changed. For example, in the peeling system 1, the above-described post-processing station 4 may not be provided and the post-processing of the target wafer W may be performed on the outside of the peeling system. Otherwise, if necessary, the edge cut device 33 in the peeling system 1 may not be provided. Further, an attaching device for attaching the dicing frame F to the superposed wafer T may be installed in the peeling system 1, and the dicing frame F may be attached to the superposed wafer T within the peeling system 1.

According to the present disclosure, it is possible to adjust a position of a superposed substrate by making a plurality of position adjustment units contacted with a side surface of the superposed substrate held in a holding unit. Therefore, the superposed substrate can be held in the holding unit in a proper position, whereby the superposed substrate can be properly separated into a target substrate and a support substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures. The present disclosure is also applicable to a case where the substrate is other substrates not a wafer such as a flat panel display (FPD) and a mask reticle for photo-mask.

What is claimed is:

1. A peeling device configured to separate a superposed substrate, in which a target substrate and a support substrate are joined to each other with an adhesive, into the target substrate and the support substrate, the peeling device comprising:
    a holding unit configured to hold the superposed substrate; and
    a plurality of position adjustment units movable toward and away from a side surface of the superposed substrate held in the holding unit, and the plurality of position adjustment units configured to perform a position adjustment of the superposed substrate relative to the holding unit by contacting the side surface of the superposed substrate and laterally moving the superposed substrate.

2. The peeling device of claim 1, wherein the holding unit holds the target substrate of the superposed substrate, and
    wherein each of the plurality of position adjustment units comes into contact with a side surface of the support substrate of the superposed substrate held in the holding unit to perform the position adjustment of the superposed substrate.

3. The peeling device of claim 1, wherein a plurality of holes configured to eject a gas is formed on a surface of the holding unit.

4. The peeling device of claim 1, wherein the superposed substrate is disposed inside an annular frame and held by a tape attached to a back side of the annular frame and a non joint surface of the target substrate.

5. The peeling device of claim 4, wherein each of the plurality of position adjustment units is movable such that it comes into contact with the side surface of the superposed substrate without contacting the annular frame.

6. The peeling device of claim 4, further comprising:
    a pressing unit configured to push the annular frame vertically downward with respect to the superposed substrate; and
    a peeling inducement unit configured to form a peeling initiation region in which a process of peeling off of the target substrate from the support substrate is initiated on a side surface of one end of the superposed substrate,
    wherein the pressing unit has a ball bearing that comes into contact with a surface of the annular frame.

7. The peeling device of claim 6, wherein the peeling inducement unit has a blade, and a movement mechanism configured to move the blade toward the side surface of the one end of the superposed substrate, and
    wherein the blade is attachable to or detachable from the movement mechanism.

8. The peeling device of claim 1, further comprising:
    a delivery unit configured to deliver the superposed substrate between an outside of the peeling device and the holding unit; and a guide unit configured to perform a position adjustment of the superposed substrate with respect to the holding unit, and installed in the delivery unit.

9. A peeling system including the peeling device according to claim 1, comprising:
a peeling station including the peeling device;
a carry-in/carry-out station configured to carry the target substrate, the support substrate, or the superposed substrate into and out of the peeling station; and
a transfer device configured to transfer at least one of the target substrate, the support substrate, and the superposed substrate between the peeling station and the carry-in/carry-out station.

10. A peeling method of separating a superposed substrate, in which a target substrate and a support substrate are joined to each other with an adhesive, into the target substrate and the support substrate, comprising:
holding the superposed substrate by a holding unit;
performing a position adjustment of the superposed substrate relative to the holding unit by making a plurality of position adjustment units contacted with a side surface of the superposed substrate held by the holding unit and making the superposed substrate move in a lateral direction; and
separating the superposed substrate that is subjected to the position adjustment in the holding unit into the target substrate and the support substrate.

11. The peeling method of claim 10, wherein in the holding the superposed substrate, the target substrate of the superposed substrate is held on the holding unit, and
wherein in performing the position adjustment, the position adjustment of the superposed substrate is performed by making the plurality of position adjustment units contacted with a side surface of the support substrate of the superposed substrate held on the holding unit.

12. The peeling method of claim 10, wherein in holding the superposed substrate and in performing the position adjustment, a gas is ejected from a surface of the holding unit to float the superposed substrate from the holding unit.

13. The peeling method of claim 10, wherein the superposed substrate is disposed inside an annular frame and is held by a tape attached to a back side of the annular frame and a non-joint surface of the target substrate.

14. The peeling method of claim 13, wherein in performing the position adjustment, each of the plurality of position adjustment units moves until it comes into contact with the side surface of the superposed substrate without contacting the annular frame.

15. The peeling method of claim 13, wherein in separating the superposed substrate, after the annular frame is vertically pushed downward with respect to the superposed substrate while a ball bearing of a pressing unit is in contact with a surface of the annular frame, a peeling initiation region in which a process of peeling off of the target substrate from the support substrate is initiated, is formed on a side surface of one end of the superposed substrate by a peeling inducement unit.

16. The peeling method of claim 10, further comprising:
delivering the superposed substrate to the holding unit from an outside of the peeling device by a delivery unit before the holding the superposed substrate,
wherein in delivering the superposed substrate, when the superposed substrate is held by the delivery unit, the position adjustment of the superposed substrate with respect to the holding unit is performed by a guide unit installed in the delivery unit.

17. A peeling device configured to separate a superposed substrate, in which a target substrate and a support substrate are joined to each other with an adhesive, into the target substrate and the support substrate, the peeling device comprising:
a holding unit configured to hold the superposed substrate; and
a plurality of position adjustment units movable toward and away from a side surface of the superposed substrate held in the holding unit, and the plurality of position adjustment units configured to perform a position adjustment of the superposed substrate relative to the holding unit by contacting the side surface of the superposed substrate,
wherein each of the plurality of position adjustment units includes an arm unit which is an elongated member and a rotational movement mechanism configured to rotate the arm unit, and
wherein the arm unit has a leading end and the leading end comes into contact with a side surface of the superposed wafer substrate when the arm unit is rotated by the rotational movement mechanism until the leading end is directed vertically and downwardly.

18. A peeling method of separating a superposed substrate, in which a target substrate and a support substrate are joined to each other with an adhesive, into the target substrate and the support substrate, comprising:
holding the superposed substrate by a holding unit;
performing a position adjustment of the superposed substrate relative to the holding unit by making a plurality of position adjustment units contacted with a side surface of the superposed substrate held by the holding unit; and
separating the superposed substrate that is subjected to the position adjustment in the holding unit into the target substrate and the support substrate,
wherein each of the plurality of position adjustment units includes an arm unit which is an elongated member and a rotational movement mechanism configured to rotate the arm unit, and
wherein the arm unit has a leading end and the leading end comes into contact with a side surface of the superposed substrate when the arm unit is rotated by the rotational movement mechanism until the leading end is directed vertically and downwardly.

* * * * *

UNITED STATES PATENT AND TRADEMARK OFFICE
CERTIFICATE OF CORRECTION

| | |
|---|---|
| PATENT NO. | : 9,601,365 B2 |
| APPLICATION NO. | : 14/263471 |
| DATED | : March 21, 2017 |
| INVENTOR(S) | : Masaru Honda and Ryoichi Sakamoto |

It is certified that error appears in the above-identified patent and that said Letters Patent is hereby corrected as shown below:

In the Claims

Claim 17, Column 26, Line 32, please delete the word "wafer".

Signed and Sealed this
Sixth Day of June, 2017

Michelle K. Lee
*Director of the United States Patent and Trademark Office*